(12) United States Patent
Zaderej et al.

(10) Patent No.: US 8,974,080 B2
(45) Date of Patent: Mar. 10, 2015

(54) LIGHT MODULE

(75) Inventors: Victor Zaderej, St. Charles, IL (US);
Daniel B. McGowan, Naperville, IL (US); Dan Nguyen, Aurora, IL (US); Barbara Grzegorzewska, Harrisburg, PA (US); Michael Picini, Naperville, IL (US)

(73) Assignee: Molex Incorporated, Lisle, IL (US)

( * ) Notice: Subject to any disclaimer, the term of this patent is extended or adjusted under 35 U.S.C. 154(b) by 471 days.

(21) Appl. No.: 13/498,051

(22) PCT Filed: Sep. 28, 2010

(86) PCT No.: PCT/US2010/050516
§ 371 (c)(1),
(2), (4) Date: Oct. 19, 2012

(87) PCT Pub. No.: WO2011/046741
PCT Pub. Date: Apr. 21, 2011

(65) Prior Publication Data
US 2013/0044485 A1 Feb. 21, 2013

Related U.S. Application Data

(60) Provisional application No. 61/250,853, filed on Oct. 12, 2009, provisional application No. 61/311,662, filed on Mar. 8, 2010.

(51) Int. Cl.
*F21V 21/00* (2006.01)
*F21V 29/00* (2006.01)
(Continued)

(52) U.S. Cl.
CPC ............... *F21K 9/00* (2013.01); *F21V 29/2231* (2013.01); *F21V 23/06* (2013.01); *F21V 17/005* (2013.01); *F21V 17/16* (2013.01); *H01L 33/64* (2013.01); *F21Y 2101/02* (2013.01); *F21V 29/246* (2013.01)

USPC ........ 362/249.02; 362/294; 362/264; 362/373

(58) Field of Classification Search
None
See application file for complete search history.

(56) References Cited

U.S. PATENT DOCUMENTS 4,510,559 A 4/1985 Kristofek
5,113,232 A 5/1992 Itoh et al.
(Continued)

FOREIGN PATENT DOCUMENTS

CN 1880844 A 12/2006
CN 201177221 Y 1/2009
(Continued)

OTHER PUBLICATIONS

International Search Report for PCT/US2010/050516, Nov. 23, 2010.
(Continued)

*Primary Examiner* — Ashok Patel
(74) *Attorney, Agent, or Firm* — Stephen L. Sheldon

(57) ABSTRACT

An illumination module is provided that can be inserted into a receptacle with a ramp that includes a wall and may be mounted on a support surface, such as a heat sink, and the illumination module include a cover and an LED assembly rotateably coupled to the cover. The LED assembly seats within the receptacle which causes terminals of the LED assembly to align with contacts on the receptacle. Circuitry is provided in the module that accepts an input voltage and converts the input to a desired driving output. The cover can be rotated relative to the receptacle so as to engage ramps so as to direct the LED assembly into the receptacle. When the LED assembly is attached to the receptacle, the terminals on the LED assembly mate with the contacts on the receptacle.

21 Claims, 19 Drawing Sheets

(51) Int. Cl.
  *F21K 99/00* (2010.01)
  *F21V 23/06* (2006.01)
  *F21V 17/00* (2006.01)
  *F21V 17/16* (2006.01)
  *H01L 33/64* (2010.01)
  *F21Y 101/02* (2006.01)

(56) References Cited

U.S. PATENT DOCUMENTS

| | | | |
|---|---|---|---|
| 6,045,240 | A | 4/2000 | Hochstein |
| 6,254,262 | B1 | 7/2001 | Crunk et al. |
| 6,498,335 | B2 | 12/2002 | Modlin et al. |
| 6,498,355 | B1 | 12/2002 | Harrah et al. |
| 6,633,485 | B1 | 10/2003 | Sigl et al. |
| 7,163,313 | B2 | 1/2007 | Rosenberg |
| 7,255,460 | B2 * | 8/2007 | Lee ................ 362/294 |
| 7,866,850 | B2 | 1/2011 | Alexander et al. |
| 8,256,934 | B2 | 9/2012 | Cunius |
| 8,414,178 | B2 | 4/2013 | Alexander et al. |
| 8,803,414 | B2 * | 8/2014 | Van De Ven et al. ....... 313/498 |
| 2005/0281047 | A1 | 12/2005 | Coushaine et al. |
| 2007/0242461 | A1 * | 10/2007 | Reisenauer et al. ....... 362/294 |
| 2008/0165536 | A1 | 7/2008 | Lai et al. |
| 2009/0213595 | A1 | 8/2009 | Alexander et al. |
| 2011/0063837 | A1 | 3/2011 | Rizkin et al. |
| 2011/0075411 | A1 * | 3/2011 | Van De Ven et al. ....... 362/235 |
| 2011/0075414 | A1 * | 3/2011 | Van De Ven et al. ....... 362/235 |
| 2013/0100658 | A1 * | 4/2013 | Pickard et al. ............. 362/230 |
| 2014/0063814 | A1 * | 3/2014 | McGowan et al. ......... 362/308 |

FOREIGN PATENT DOCUMENTS

| | | |
|---|---|---|
| GB | 878221 A | 9/1961 |
| GB | 1089181 A | 11/1967 |
| JP | 06-310232 A | 11/1994 |
| JP | 2006-313727 A | 11/2006 |
| JP | 2007-073478 A | 3/2007 |
| JP | 2007-173128 A | 7/2007 |
| WO | WO 2008/086665 A1 | 7/2008 |

OTHER PUBLICATIONS

ACC Silicones SG502 High Thermally Conductive Grease Technical Data Sheet [retrieved on Mar. 22, 2012]. Retrieved from internet. <URL: http://www.acc-silicones.com>. The whole document.

MatWeb Material Property Data "Aluminum Alloys, General" [retrieved Mar. 22, 2012]. Retrieved from internet. <URL: http://www.matweb.com>. The whole document.

* cited by examiner

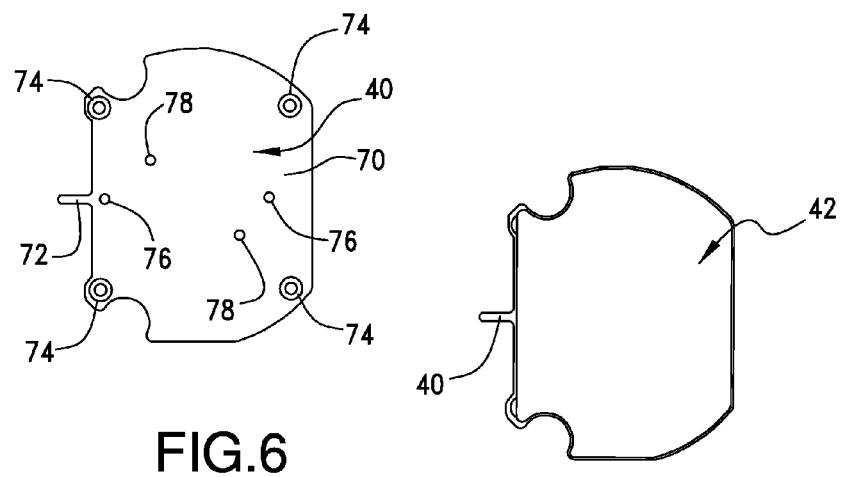
FIG.6
FIG.7
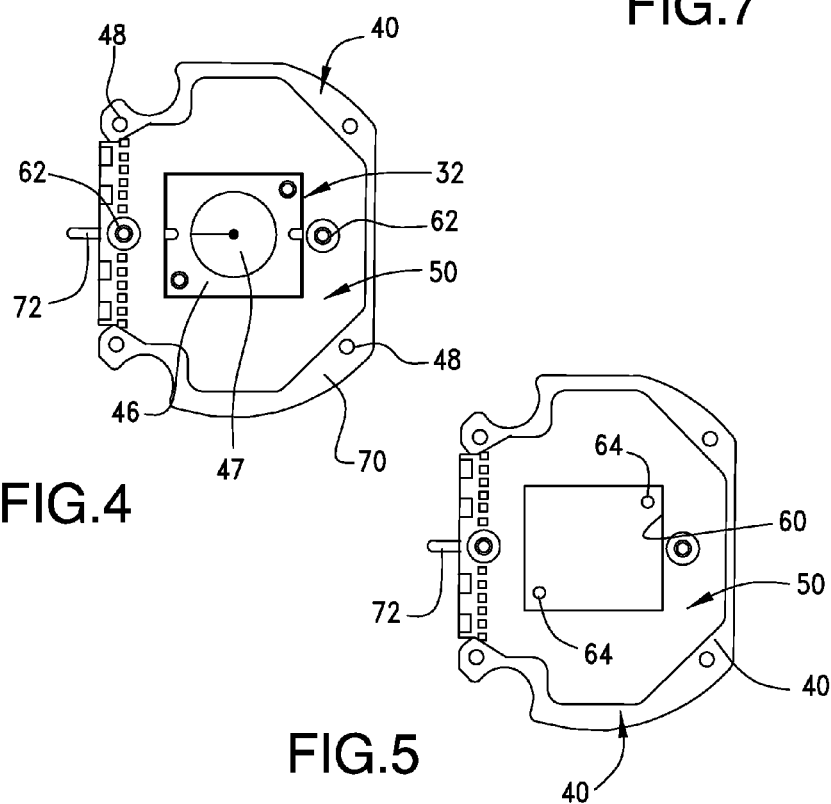
FIG.4
FIG.5

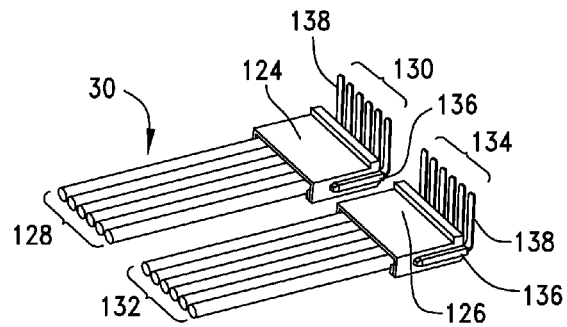
FIG. 17
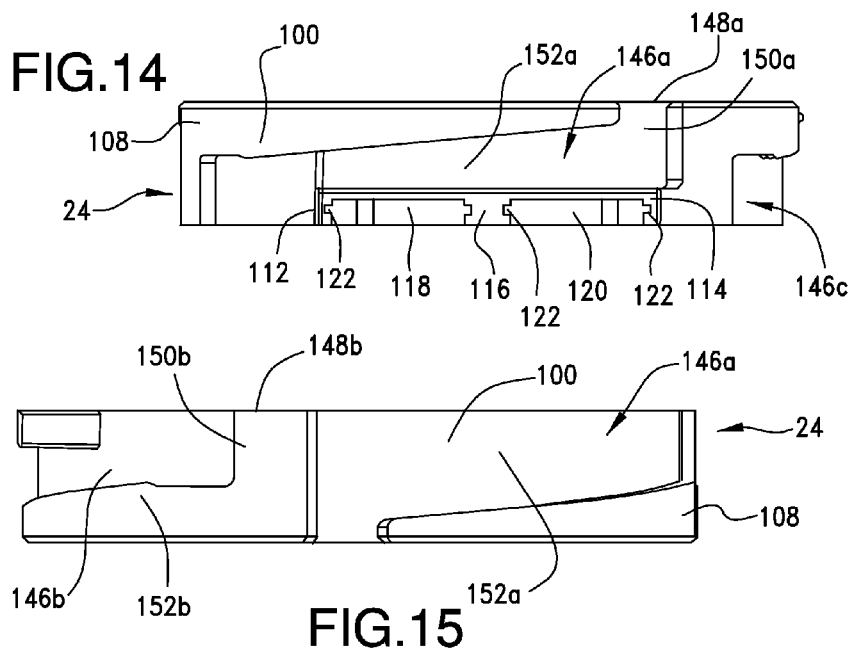
FIG. 14
FIG. 15
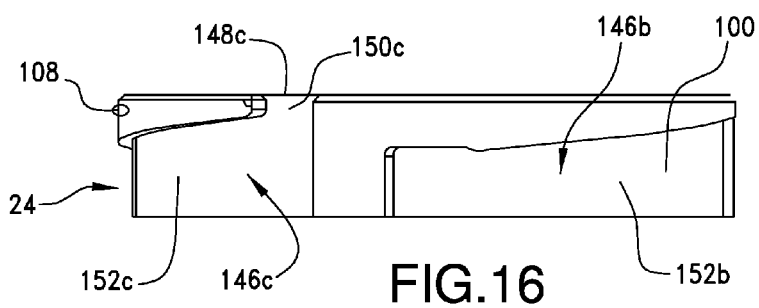
FIG. 16

LIGHT MODULE

This application is a national phase of PCT Application No. PCT/US10/50516, filed Sep. 28, 2010, which claims priority to U.S. provisional application Ser. No. 61/250,853, filed Oct. 12, 2009, and to U.S. provisional application Ser. No. 61/311,662, filed on Mar. 8, 2010, the disclosure of each being incorporated herein by reference in its entirety.

FIELD OF THE INVENTION

The present invention relates to field of illumination, more specifically to a light emitting diode based module that is capable of being thermally coupled to a heat sink.

BACKGROUND OF THE INVENTION

A number of solid state lighting technologies exist and one of the more promising types for illumination purposes is a light emitting diode (LED). LEDs have dramatically improved and now can provide high efficiencies and high lumen output. One long standing issue with LEDs, however, is that they are susceptible to damage if not protected from heat. Generally speaking, a LED will have a reduced life and less pleasing color output as the operating temperature of the LED increases. In addition to the issues with heat, the ability of an LED to act as a point source provides desirable lighting properties, but can be challenging to package in a manner that is convenient. Often LEDs are a permanent part of a fixture and while the life of a LED is quite long, there is still the problem of having to replace an entire fixture if the LED fails prematurely or even after the 20-50,000 hours of life. One way to address this issue to provide a modular LED system. Existing attempts to provide desired modularity have not proven to be sufficient. Thus, further improvements in how LEDs can be mounted would be appreciated by certain individuals.

SUMMARY OF THE INVENTION

An illumination system includes a light module which can be mounted in a receptacle. The light module includes a cover that is rotateably coupled to an LED assembly. The LED assembly includes a heat spreader to help ensure there is low thermal resistance between an LED array supported by the LED assembly and a corresponding support surface. The LED assembly can include a frame that supports the heat spreader and plurality of terminals can be supported by the frame, wherein at least two terminals are electrically coupled to an anode and cathode of the LED array. Circuitry is configured to receive an input voltage and convert it to the appropriate voltage configured to operate the LED array. A biasing element can be positioned between the cover and the frame to urge them apart. The receptacle can include a wall that supports contacts. Ramps can be provided on the wall and when a cover rotateably engages the ramps, directs a LED assembly vertically into the receptacle.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which:

FIG. 4 is a top plan view of an embodiment of the LED assembly;

FIG. 5 is a simplified view of the view depicted FIG. 4;

FIG. 6 is a bottom plan view of the embodiment depicted in FIG. 4;

FIG. 7 is a bottom plan view of a heat spreader having a thermal pad mounted thereon;

FIGS. 14-16 are side elevational views of the receptacle;

FIG. 17 is a perspective view of a terminal wire assembly with which the light module is used;

DETAILED DESCRIPTION OF THE ILLUSTRATED EMBODIMENTS

Figure 1:
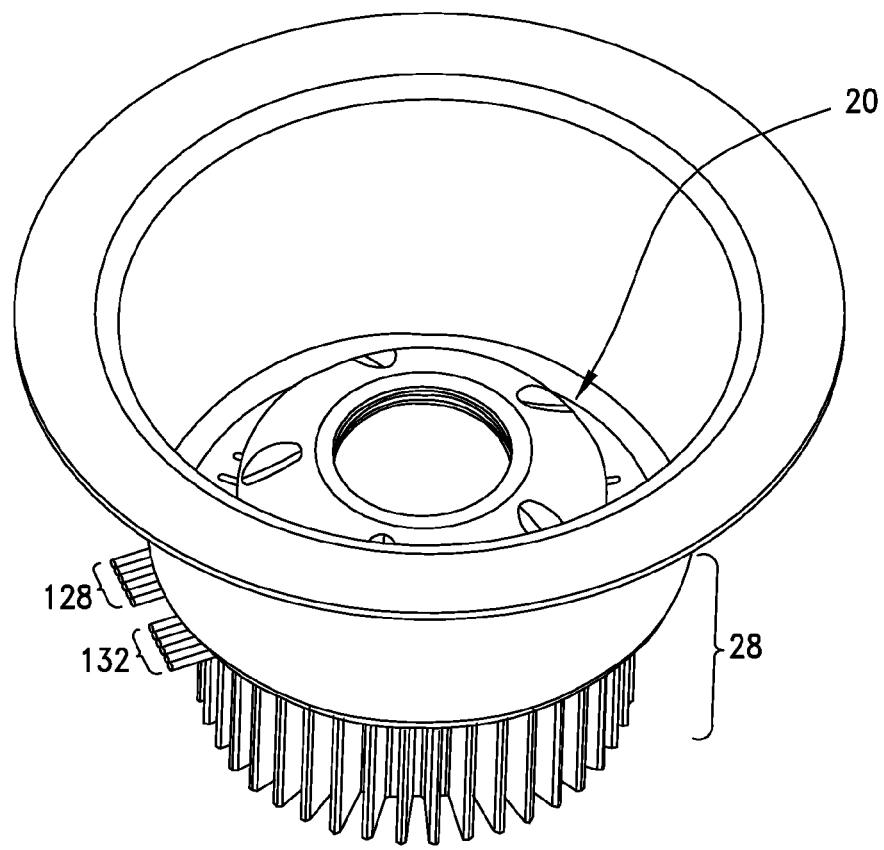
FIG. 1 is a perspective view of a first embodiment of a illumination system mounted to a heat sink.
Figure 2:
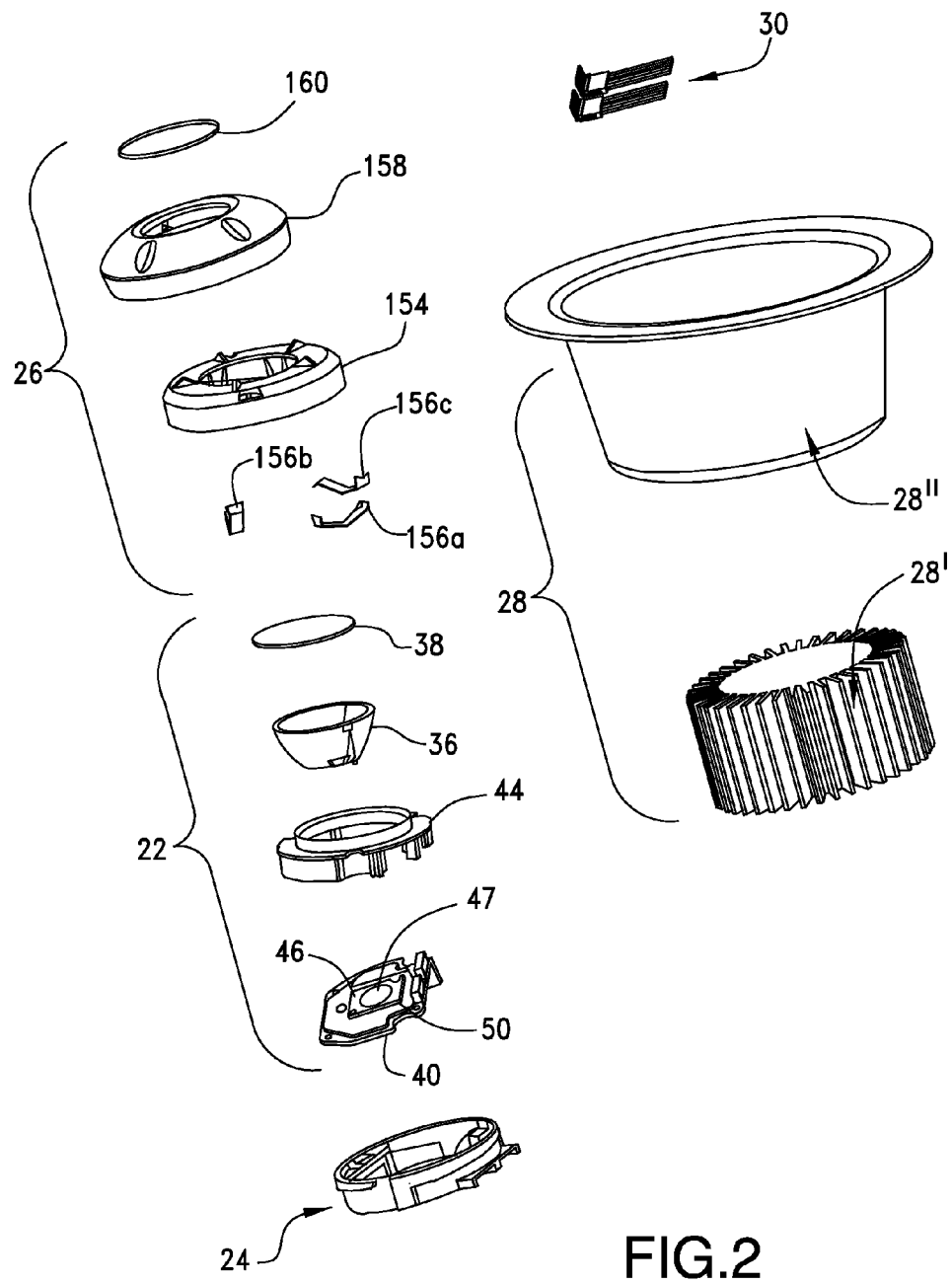
FIG. 2 is an exploded perspective view of the light module and heat sink.

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein. Therefore, unless otherwise noted, features disclosed herein may be combined together to form additional combinations that were not otherwise shown for purposes of brevity.

A first embodiment of a light module 20 is shown in FIGS. 1-26 and a second embodiment of a light module 1020 is shown in FIGS. 28-34. While the terms lower, upper and the like are used for ease in describing the light module 20, 1020 it is to be understood that these terms do not denote a required orientation for use of the light module 20, 1020. The light module 20, 1020 is aesthetically pleasing. Other configurations with different appearances, such as square or some other shape light modules, as well as with different heights and dimensions are possible.

Attention is invited to the first embodiment of the light module 20 shown in FIGS. 1-26. The light module 20 includes a LED assembly 22, an insulative receptacle 24 and an insulative cover assembly 26. The light module 20 is connected to a support surface 28 (which may also be referred to as a heat sink) for supporting the LED assembly 22 and for dissipating thermal energy. It should be noted that any desirable shape may be used for the support surface and the particular shape selected will vary depending on the application and the surrounding environment. The light module 20 is connected to a terminal wire assembly 30 which is, in turn, connected to a power source.

Figure 3:
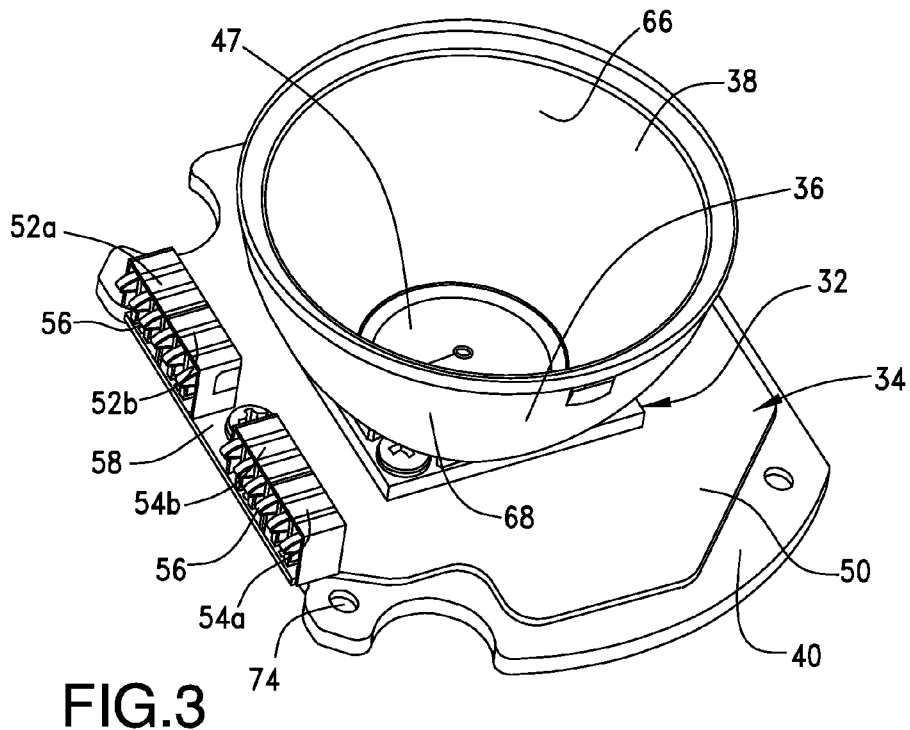
FIG. 3 is a perspective partial view of an embodiment of an LED assembly.

The LED assembly 22, see FIGS. 3-5, includes a LED module 32, a support assembly 34 (which may be a printed circuit board or other desirable structure), a heat spreader 40 and a thermal pad 42, all of which are supported, directly or indirectly, by an insulative frame 44. The insulative frame 44 may further help support a reflector 36 and its associated diffuser 38. The LED module 32 and the support assembly 34, which are electrically coupled to each other, are mounted on or adjacent the heat spreader 40 (preferably the LED module 32 is mounted securely to the heat spreader 40 so as to ensure good thermal conductivity therebetween). The heat spreader 40 is in turn fastened to the frame 44 and in an embodiment can be heat-staked to the frame 44. The reflector 36 is positioned adjacent the LED module 32 and can be supported directly by the LED module 32 or can be supported by the frame 44 or other means. The thermal pad 42 can be provided on the underside of the heat spreader 40.

The depicted LED module 32 includes a generally flat thermally conductive base 46 which can support the anode/cathode (potentially via an electrically insulative coating provided on a top surface), and an LED array 47 which is mounted on the top surface of the base 46, which may be a thermally conductive material such as aluminum. As depicted, the base 46 includes apertures 48 for receiving fasteners. The depicted design LED module, which can be provided with an LED package provided by BRIDGELUX, offers good thermal conductivity between the LED array and the heat spreader. It should be noted that in other embodiments, the array could be a less thermally conductive material and include thermal vias to help transfer thermal energy from the LED array to a corresponding heat spreader.

The support assembly 34, as depicted, includes a support 50, which can be a conventional circuit board or a plastic structure, having a first pair of insulative connectors 52a, 52b mounted thereon and a second pair of insulative connectors 54a, 54b mounted thereon, preferably on the edge thereof, and a plurality of conductive terminals 56 housed in the connectors 52a, 52b, 54a, 54b. The support 50 can be of conventional design and has traces provided thereon. The first pair of connectors 52a, 52b are spaced apart from the second pair of connectors 54a, 54b such that a gap 58 is provided. The terminals 56 are connected to the traces on the support 50 in a known manner. An aperture 60 is provided through support 50 in which the base 46 of the LED module 32 is seated. Apertures 62 are provided for receiving fasteners to connect the support 50 to the heat spreader 40. As illustrated, apertures 78 are formed through the heat spreader 40 and align with apertures 48 for receiving fasteners therethrough to connect the base 46 to the heat spreader 40. In an alternative embodiment, the base 46 may be coupled directly to the heat spreader 40 via solder or thermally conductive epoxy. If fasteners are used to couple the base 46 and the heat spreader 40, a thin coating of a thermal grease or paste may be beneficial to ensure there is a good thermal connection between the base 46 and the heat spreader 40.

The reflector 36 is formed by an open-ended wall having a lower aperture and an upper aperture. The wall includes an inner surface 66 and an outer surface 68. Typically, the inner surface 66 is angled and has its largest diameter at its upper end and tapers inwardly. The reflector 36 can be mounted on the base 46 of the LED module 32 by suitable means, such as adhesive, such that the LED array 47 is positioned within the lower aperture of the reflector 36. The diffusor 38 (in combination with the reflector) can have the desired optical to shape the light emitted from the LED array 47 as desired. The inner surface 66 of the reflector 36 (which may be faceted in a vertical and horizontal manner, or only in a vertical or horizontal, or without facets if a different effect is desired) may be plated or coated so as to be reflective (with a reflectivity of at least 85 percent in the desired spectrum) and in an embodiment may be highly reflective (more than 95 percent reflective in the desired spectrum) and may be specular or diffuse.

As shown in FIG. 6, the heat spreader 40 is a thin metal plate can be formed of copper or aluminum or other suitable material (preferably with a thermal conductivity greater than 50 W/m-K so as to reduce thermal resistance). The heat spreader 40 has a main body portion 70 and a tongue 72 extending outwardly therefrom. As can be appreciated, the tongue 72 helps provide an orientation feature that ensures that LED assembly 22 is positioned correctly with respect to the receptacle 24. Apertures 74 are formed in the heat spreader 40 at the corners of the main body portion 70. Apertures 76 are formed through the heat spreader 40 and are aligned with apertures 62 through the support 50 for receiving fasteners therethrough to connect the support 50 to the heat spreader 40. Apertures 78 are formed through the heat spreader 40 and are aligned with apertures 64 through the LED module 32 for receiving fasteners therethrough to connect the LED module 32 to the heat spreader 40.

As shown in FIG. 7, the thermal pad 42 is provided on and generally covers the underside main body portion 70 of the heat spreader 40. The thermal pad 42 is soft, compliant and may be tacky. The thermal pad 42 may be a conventional thermal pad material used in the industry to thermally couple two surfaces together, such as, but not limited to, 3M's Thermally Conductive Adhesive Transfer Tape 8810. If formed of the thermally conductive adhesive gasket, the thermal pad 42 can be cut to the desired shape from bulk stock and applied in a conventional manner and could have one side that includes an adhesive for adhering to the heat spreader 40 while the other side could be removably positioned on support surface 28 (e.g., the heat sink). Of course, the thermal pad 42 could also be provided via the use of a thermally-conductive paste or a thermally conductive epoxy positioned on the heat spreader 40. The benefit of using a pad with an adhesive side is that the thermal pad 42 can be securely positioned on the heat spreader 40 and compressed between the heat spreader 40 and the resulting support surface 28 while allowing the thermal pad 42 (and the associated components) to be removed if there is a desire to replace or upgrade those components.

The support 50 seats on the main body portion 70 of the heat spreader 40, and the base 46 of the LED module 32 seats within the aperture 60 through the support 50 and seats on the main body portion 70 of the heat spreader 40. Thus, the LED module 32 is in direct thermal communication with the heat spreader 40 and the thermal interface between the LED module 32 and the heat spreader 40 is controlled so as to reduce thermal resistivity to a level that can be less than 3 K/W and more preferably below 2 K/W. For example, if desired, the base 46 can be coupled to the heat spreader 46 via a solder operation that allows for very efficient thermal transfer between the base 46 and the heat spreader 40. As the area of the base 46 can be less than 600 mm$^2$ and the area of the heat spreader 40 can be more than double the area and in an embodiment can be more than three or four times the area (in an embodiment the heat spreader area can be greater than 2000 mm$^2$, the total thermal resistance between the LED array 47 mounted and the support surface can be less than 2.0 K/W. Naturally, this assumes the use of a thermal pad with good thermal performance (conductivity preferably better than 1 W/m-K) but because of the larger area and the ability to use a thin thermal pad (potentially 0.5-1.0 mm thick or even thinner), such performance is possible with a range of thermal pad materials.

Figure 8:
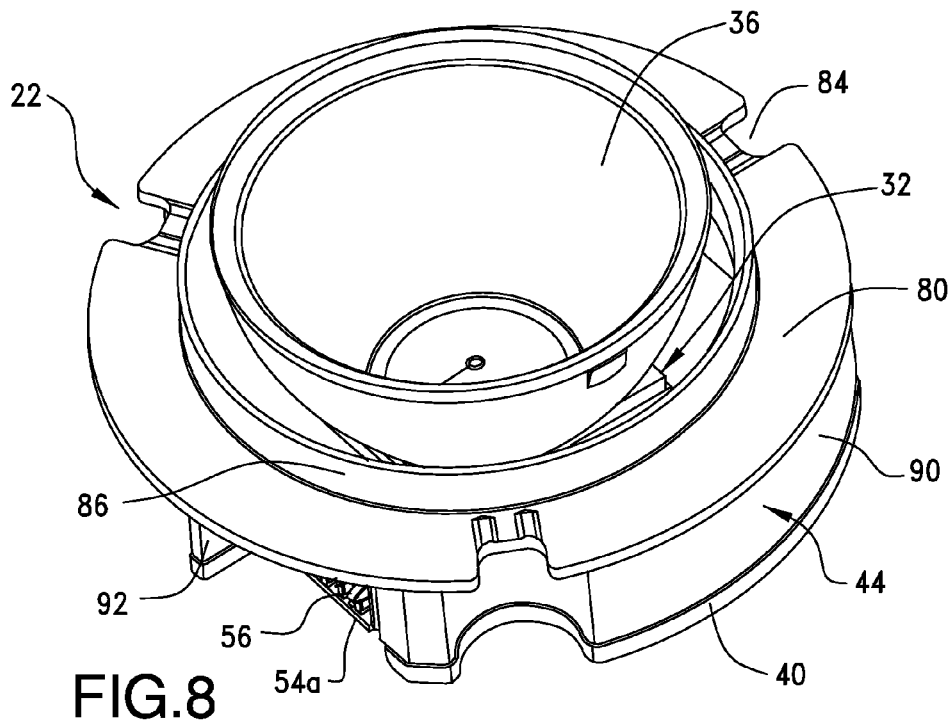
FIG. 8 is a perspective view of an embodiment of an LED assembly.
Figure 9:
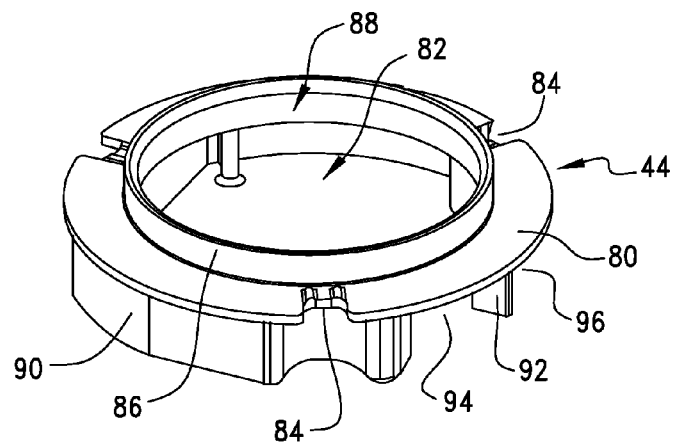
FIG. 9 is a top perspective view of a frame which is a component of the LED assembly.
Figure 10:
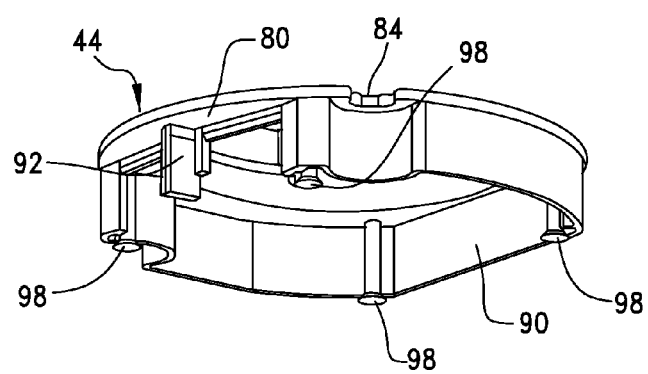
FIG. 10 is a bottom perspective view of the frame.
Figure 13:
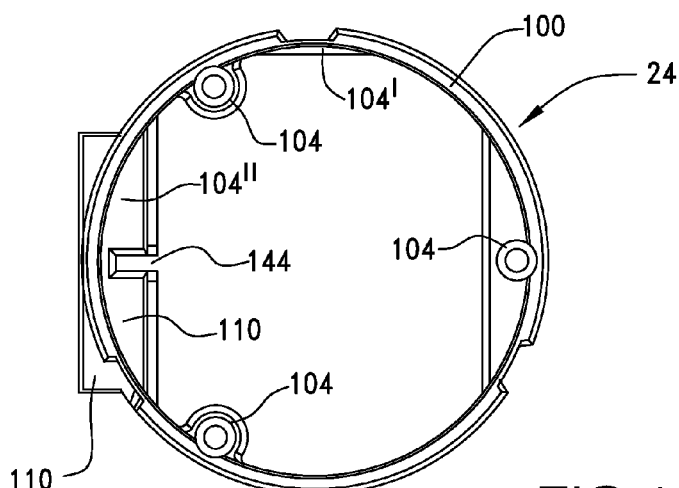
FIG. 13 is a top plan view of the receptacle.
Figure 11:
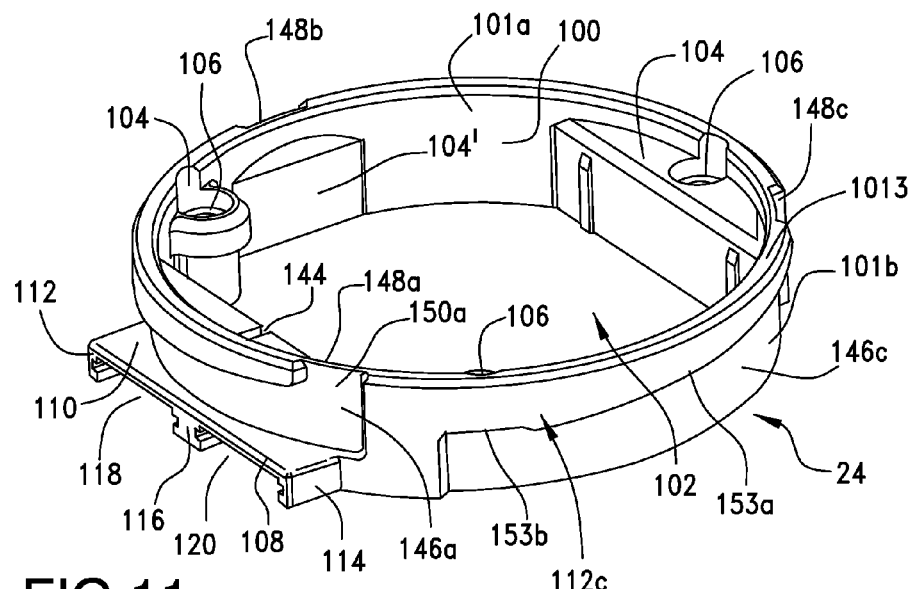
FIG. 11 is a top perspective view of a receptacle which is a component of the light module.
Figure 12:
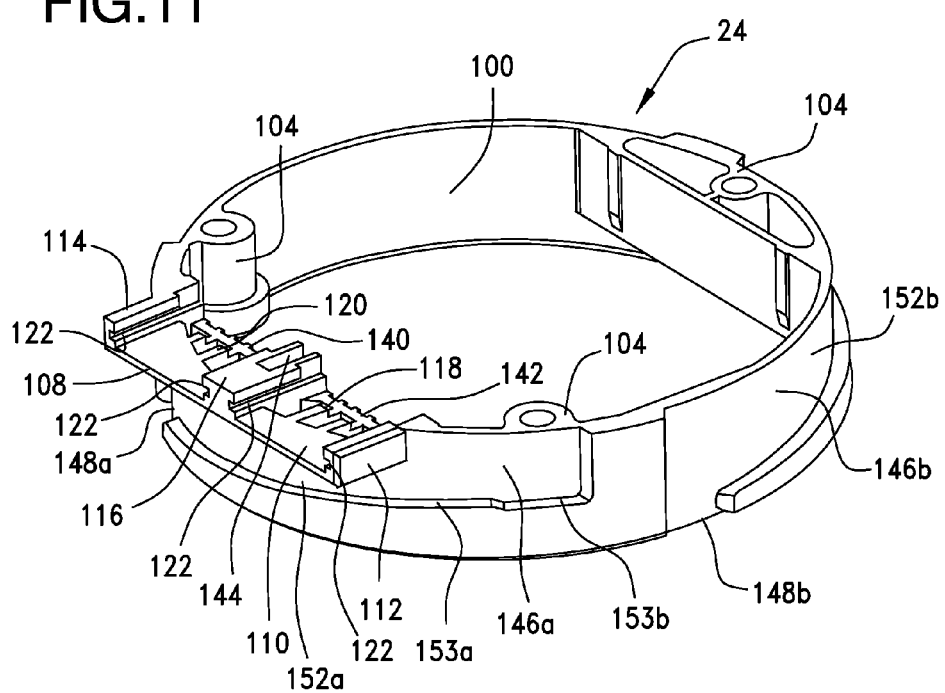
FIG. 12 is a bottom perspective view of the receptacle.

The frame 44, see FIGS. 8-10, is formed from a circular base wall 80 defining a passageway 82 therethrough. A plurality of cutouts 84, which as shown are three in number, are provided in the outer periphery of the base wall 80. A circular upper extension 86 extends upwardly from the base wall 80 and defines a passageway 88 which aligns with the passageway 82 through the base wall 80. A lower extension 90 extends partially around the base wall 80 and extends downwardly therefrom, such that a gap is formed between the ends of the lower extension 90. The lower extension 90 is offset outwardly from the upper extension 86. A key 92, which as shown takes the form of a flat wall, extends downwardly from the base wall 80 and is positioned within the space. As a result, first and second connector receiving recesses 94, 96 are formed between the key 92 and the respective ends of the lower extension 90. The first pair of connectors 52a, 52b, which is mounted on the support 50, is mounted within the first connector receiving recess 94, and the second pair of connectors, which is mounted on the support 50, is mounted within the second connector receiving recess 96. A plurality of feet 98 extend downwardly from the lower extension 90 and pass through the apertures 74 in the heat spreader 40. The main body portion 70 abuts against the bottom surface of the extension 90. The tongue 72 abuts against the bottom surface of the key 92. The feet 98 are heat staked to the heat spreader 40.

The receptacle 24, as depicted in FIGS. 11-16, includes a circular base wall 100 having a passageway 102 therethrough. The base wall includes an inner surface 101a, an outer surface 101b and a top surface 101c. The outer surface 101b can provide a circular profile that would allow a mating circular shaped wall to translate relative to the outer surface 101b. A plurality of frame supports 104 extend inwardly from the inner surface 101a of the base wall 100. Each frame supports 104 commences at the lower end of the base wall 100 and terminates below the upper end of the base wall 100. As shown, three frame supports 104 are provided. An aperture 106 is provided through each frame support 104. Additional frame supports without apertures, such as frame support 104', can be provided.

The lower end of the base wall 100 has a connector housing 108 into which the terminal wire assembly 30 can be mounted. As depicted, the connector housing 108 includes an upper wall 110 which extends inwardly from the inner surface of the base wall 100 a predetermined distance and extends outwardly from the outer surface of the base wall 100 a predetermined distance, opposite side walls 112, 114 which extend downwardly from the upper wall 110, and a central wall 116 which extend downwardly from the upper wall 110 and is spaced from the side walls 112, 114. The lower ends of the side and central walls 112, 114, 116 are flush with the lower end of the base wall 100. Each wall 112, 114, 116 includes a groove 122 therein which extends from the outer ends to the inner ends thereof. The top surface of the portion of the upper wall 110 which extends inwardly from the inner surface of the base wall 100 is flush with the top surfaces of the frame supports 104, 104' and forms an additional frame support 104''. As a result, first and second wire receiving recesses 118, 120 are formed by the connector housing 108. As can be appreciated, the depicted configuration allows conductors (such as insulated wires) to extend from the base wall in a right-angle like construction. If desired (and if the support surface 28 were so configured) the housing could be configured to extend into an aperture in the support surface 28 so as to provide a more vertical like construction.

As shown in FIG. 17, the terminal wire assembly 30 includes first and second insulative housings 124, 126, a first set of wires 128 extending into the first insulative housing 124 which are soldered to a first set of terminals 130 which extend out of the first insulative housing 124, and a second set of wires 132 extending into the second insulative housing 126 which are soldered to a second set of terminals 134 which extend out of the second insulative housing 126. The wires 128/terminals 130 can be insert molded into the first housing 124 and the wires 130/terminals 132 can be insert molded into the second housing 126. The first insulative housing 124 is mounted in the first wire receiving recess 118 and the second insulative housing 126 is mounted in the second wire receiving recess 120. Each insulative housing 120 has generally flat upper and lower walls, and side walls which connect the upper and lower walls together. A plurality of passageways are provided through each housing 124, 126 into which the wires 138, 132 and the terminals 130, 134 extend. Each passageway commences at a front end of the walls, and terminates at a rear end of the walls. Each side wall has a tongue 136 extending outwardly therefrom which commences at the rear end and extends towards the front end a predetermined distance. Each terminal 130, 134 is generally L-shaped and has a first leg which is mounted within the respective passageways in the respective housing 124, 126, and a second leg 138 which extends perpendicularly to the first leg and upwardly from the upper wall of the respective housing 124, 126.

The first housing 124 is mounted in the first wire receiving recess 118 and the tongues 136 on the side walls fit within the grooves 122 in the side wall 112 and the central wall 116. The second legs 138 seat within recesses 140 provided in the rear surface of the first housing 124 and the inner surface of the base wall 100. The recesses 140 have a depth which is greater than the thickness of the second legs 138 so that the inner surfaces of the second legs 138 are offset from the inner surfaces of the first housing 124 and the base wall 100. The second housing 126 is mounted in the second wire receiving recess 120 and the tongues 136 on the side walls fit within the grooves 122 in the side wall 114 and the central wall 116. The second legs 138 seat within recesses 142 provided in the rear surface of the second housing 126 and the inner surface of the base wall 100. The recesses 142 have a depth which is greater than the thickness of the second legs 138 so that the inner surfaces of the second legs 138 are offset from the inner surfaces of the second housing 126 and the base wall 100. Alternatively, the inner surfaces of the second legs 138 and the inner surfaces first/second housings 124/126 and the base wall 100 may be flush. A keyway 144, which conforms to the shape of the key 92 of the frame 44, can be formed through the frame support 104' and the central wall 116.

The passageway 102 of the receptacle 24 receives the LED assembly 22 therein. The lower end of the base wall 80 of the frame 44 seats on the upper ends of the frame supports 104, 104', 104''; and the lower extension 90 and the heat spreader 40 seat within the passageway 102. Since there are at least three frame supports 104, 104', 104'', this prevents the LED assembly 22 from being tilted as the LED assembly 22 is inserted into the receptacle 24. The key 92 on the frame 44 and the tongue 72 of the heat spreader 40 seat within the keyway 144. As such, the key 92 and keyway 144 provide a polarizing feature to ensure the correct orientation of the LED assembly 22 with the receptacle 24. The upper extension 86 may extend above the top surface of the base wall 100 of the receptacle 24. The cutouts 84 align with the apertures 104 and the base wall 80 sits on top of the frame supports 104, 104', 104'' to ensure proper support for the LED module 32. The terminals 56 in the connectors 52a, 54b mate with the terminals 138 mounted in the first housing 124, and the terminals 56 in the connectors 54a, 54b mate with the terminals 138 mounted in the second housing 126. The LED assembly 22 can move upwardly and downwardly relative to the receptacle 24 but as depicted, is limited in its ability to rotate with respect to the receptacle 24.

The outer surface of the base wall 100 has a plurality of generally L-shaped slots 146a, 146b, 146c formed thereon. The opening 148a, 148b, 148c of each slot 146a, 146b, 146c is at the upper end of the base wall 100. Each slot 146a, 146b, 146c has a first leg 150a, 150b, 150c which extends perpendicularly downwardly from the upper end of the base wall 100 and a second leg 152a, 152b, 152c which extends from the lower end of the first leg 150a, 150b, 150c, and extends downwardly and around the outer surface of the base wall 100. As a result, the surfaces which form the upper and lower walls of the second legs 152a, 152b, 152c form ramps that each have ramp surface 153a and retaining surface 153b. The ramp surfaces 153a can be at substantially the same angle and the retaining surface 153b can be positioned closer to the top surface 101c than the end of the ramp surface 153a so as to allow a matching shoulder to be translated along the ramp surface 153a by rotating a corresponding cover. Once the cover was rotated far enough, it could translate upward slightly (the translation being due to the springs) so as to rest on the retaining surface 153b. Thus, the depicted design allows the cover to be retained in a desired position.

As shown, three slots 146a, 146b, 146c are provided on the outer surface of the base wall 100. The ends of the second legs 152a, 152b, 152c opposite to the respective first legs 150a, 150b, 150c may be open to the lower end of the base wall 100. The cover assembly 26 includes an inner cover 154 that supports a biasing element, which could be a plurality of springs 156a, 156b, 156c. The cover assembly 26 may further include an outer cover 158, which could have a diffuser 160 mounted thereon. The inner cover 154 mounts to the frame 44 and the biasing element is sandwiched between the inner cover 154 and the frame 44. As shown, the springs 156a, 156b, 156c are leaf springs, however, it is contemplated that other types of biasing elements besides springs can be used, such as a compressible material or element. Furthermore, while the depicted biasing element includes a plurality of leaf springs, a single spring (such as a circular wave spring) could also be used. As depicted, the outer cover 158 is decorative and mounts over the inner cover 154.

Figure 18:
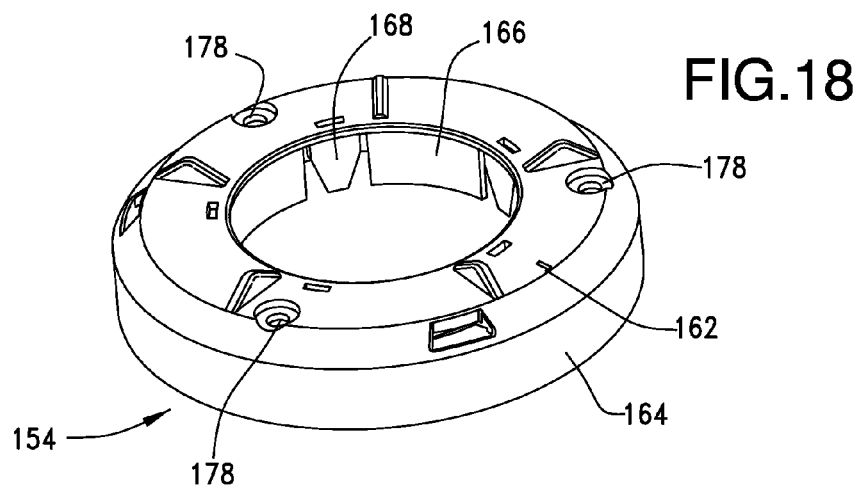
FIG. 18 is a top perspective view of an inner cover which is a component of the light module.
Figure 20:
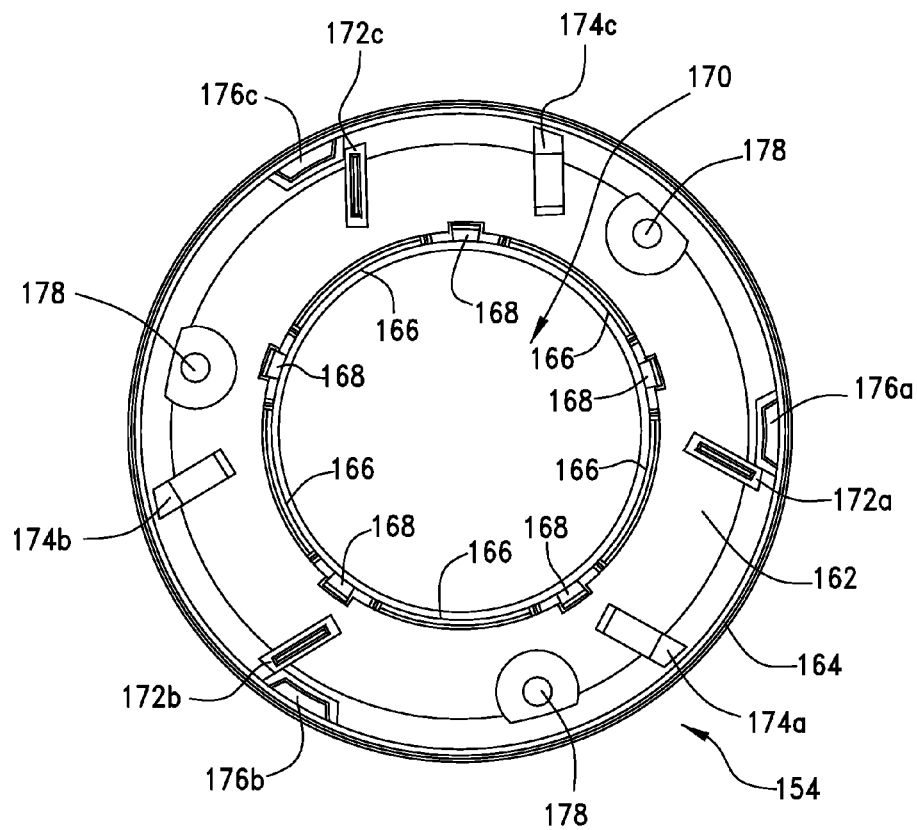
FIG. 20 is a bottom plan view of the inner cover.
Figure 19:
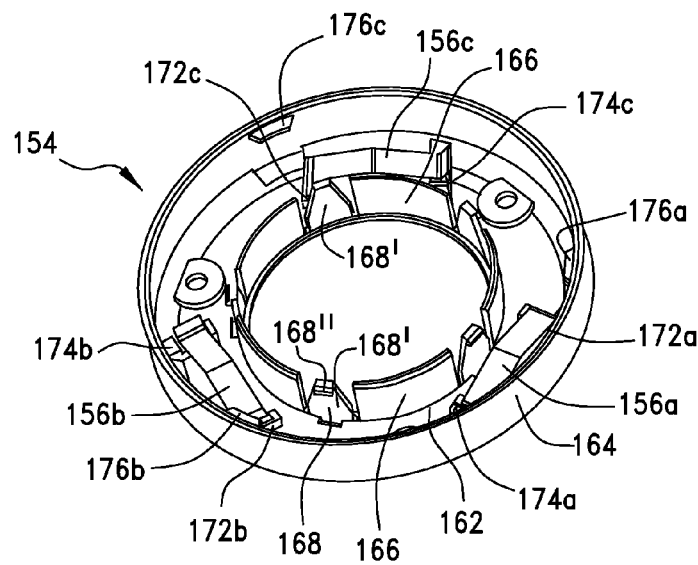
FIG. 19 is a bottom perspective view of the inner cover.

The inner cover 154, FIGS. 18-20, includes an upper circular wall 162, a base wall 164 extending downwardly from the outer edge of the upper wall 162, a plurality of flanges 166 and holding projections 168 depending downwardly from the inner edge of the upper wall 162. The flanges 166 and the holding projections 168 alternate around the circumference of the upper wall 162. A central passageway 170 is formed by the flanges 166 and the holding projections 168 into which the reflector 36 is seated. The flanges 166 and the holding projections 168 have a height which is less than the height of the base wall 164, however, the flanges 166 and the holding projections 168 have a height which is greater than the combined height of the base wall 80 and upper extension 86 of the frame 44. Each holding projection 168 includes a flexible arm 168' extending from the upper wall 162 with a head 168'' at the end thereof.

Three pairs of spring retaining housings 172a, 172b, 172c and spring mounting housings 174a, 174b, 174c extend downwardly from the bottom surface of the upper wall 162. The associated pairs of housings 172a/174a, 172b/174b, 172c/174c are equi-distantly spaced apart from each other around the circumference of the upper wall 162. A spring 156a, 156b, 156c is attached to the associated pair of housings 172a/174a, 172b/174b, 172c/174c. For each pair of housings 172a/174a, 172b/174b, 172c/174c, one end of the spring 156a, 156b, 156c is fixed to the spring retaining housing 172a, 172b, 172c and the other end of the spring 156a, 156b, 156c seats on top of the spring mounting housing 174a, 174b, 174c. As a result, each spring 156a, 156b, 156c can move from an unflexed position where the apex of the spring 156a, 156b, 156c is farthest away from the upper wall 162, to compressed position where the apex of the spring 156a, 156b, 156c is closest to upper wall 162, or to any position in between the unflexed position and the compressed position. It should be noted that a biasing element may not be needed when tolerances are sufficiently controlled. However, for many applications the biasing element will provide a desired design feature as it can help counteract potential tolerance stack-up in a receptacle, module and the support surface.

Projections 176a, 176b, 176c extend inwardly from the inner surface of the base wall 164 proximate to the lower edge thereof. As depicted, the projections 176a, 176b, 176c are equi-distantly spaced apart from each other around the circumference of the base wall 164. The projections 176a, 176b, 176c are proximate to the spring retaining housings 172a, 172b, 172c.

Three apertures 178 extend through the upper wall 162 at equi-distantly spaced positions around the upper wall 162. The apertures 178 are used to attach the outer cover 158 to the inner cover 154.

The inner cover 154 is mounted on the frame 44 and the receptacle 24 such that the springs 156a, 156b, 156c are sandwiched between the upper wall 162 of the inner cover 154 and the base wall 80 of the frame 44. The flanges 166 and the holding projections 168 pass through the aligned passageway 88, 82 through the upper extension 86 and the base wall 80 and abut against the inner surfaces of the upper extension 86 and the base wall 80. The flexible arms 168' of the holding projections 168 move inwardly as the heads 168'' are slid along the inner surface of the upper extension 86 and base wall 80. Once the heads 168'' clear the lower end of the base wall 80, the holding projections 168 resume their original state. As a result, the inner cover 154 and the frame 44 are snap-fit together such that the holding projections 168 prevent the removal of the inner cover 154 from the frame 44. Because the holding projections 168 have a length which is greater than the combined height of the base wall 80 and the upper extension 86, the inner cover 154 can move upwardly and downwardly relative to the frame 44. The base wall 164 of the inner cover 154 encircles the base wall 100 of the receptacle 24. The projections 176a, 176b, 176c engage within the slots 146a, 146b, 146c on the receptacle 24.

Figure 21:
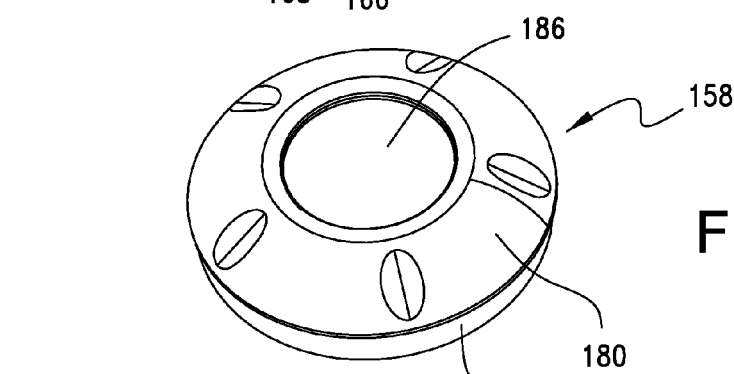
FIG. 21 is a top perspective view of an outer cover which is a component of the light module.
Figure 22:
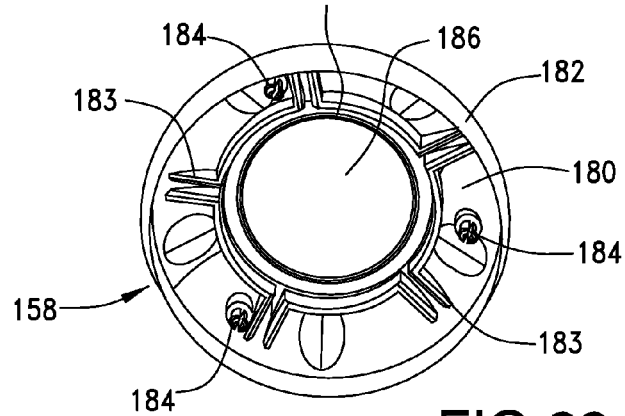
FIG. 22 is a bottom perspective view of the outer cover.

The outer cover 158, see FIGS. 21 and 22, is decorative and can attach to and overlay the inner cover 154. The outer cover 158 has an upper wall 180 which overlays the upper wall 162 of the inner cover 154, an inner wall 181 which depends downwardly from the inner end of the upper wall 180, and an outer wall 182 which depends downwardly from the outer end of the upper wall 180 and overlays the base wall 164 of the inner cover 154. A plurality of gussets 183 extend radially outwardly from the inner wall 181. The lower end of the inner wall 181 and the lower ends of the gussets 183 seat against the upper wall 162 of the inner cover 154. The outer cover 158 either snap-fits or is fastened to the inner cover 154 by suitable means. As shown in FIG. 22, three projections 184 extend from the bottom surface of the upper wall 180 which fit into apertures 178 in the upper wall 162 of the inner cover 154. The inner wall 181 defines an aperture 186 which aligns with the passageways 170, 88, 82, 102. The diffuser 160 is mounted in the aperture 186. The outer cover 158, along with its diffuser 160, thus helps protect the LED assembly 22 from damage.

To provide good thermal dissipation, the support surface 28 can be formed of a thermally conductive material such as aluminum or the like. Other possible alternatives include conductive and/or plated plastics. If used, the plating on the support surface 28 may be a conventional plating commonly used with plated plastics and the support surface 28 may be formed via a two shot-mold process. The benefit of using materials similar to aluminum is that they tend to conducts heat readily throughout the material, thus provide efficient heat transfer away from the source. The benefit of using a plated and/or conductive plastic is that there is a possibility to reduce weight.

Figure 23:
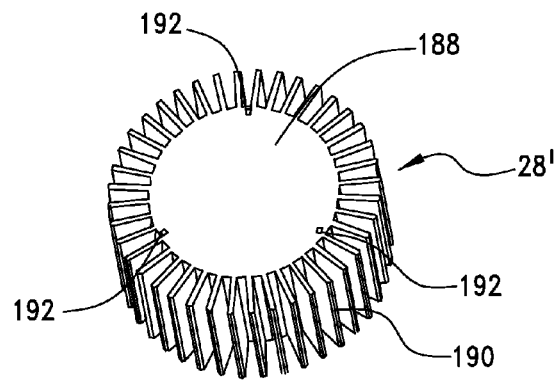
FIG. 23 is a perspective view of a first form of a heat sink with which the light module can be used.
Figure 24:
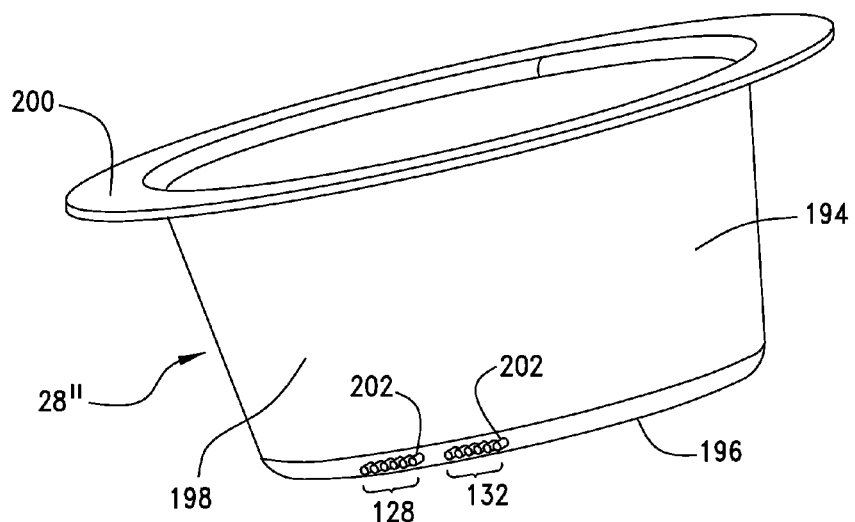
FIG. 24 is a perspective view of a second form of a heat sink with which the light module can be used.
Figure 25:
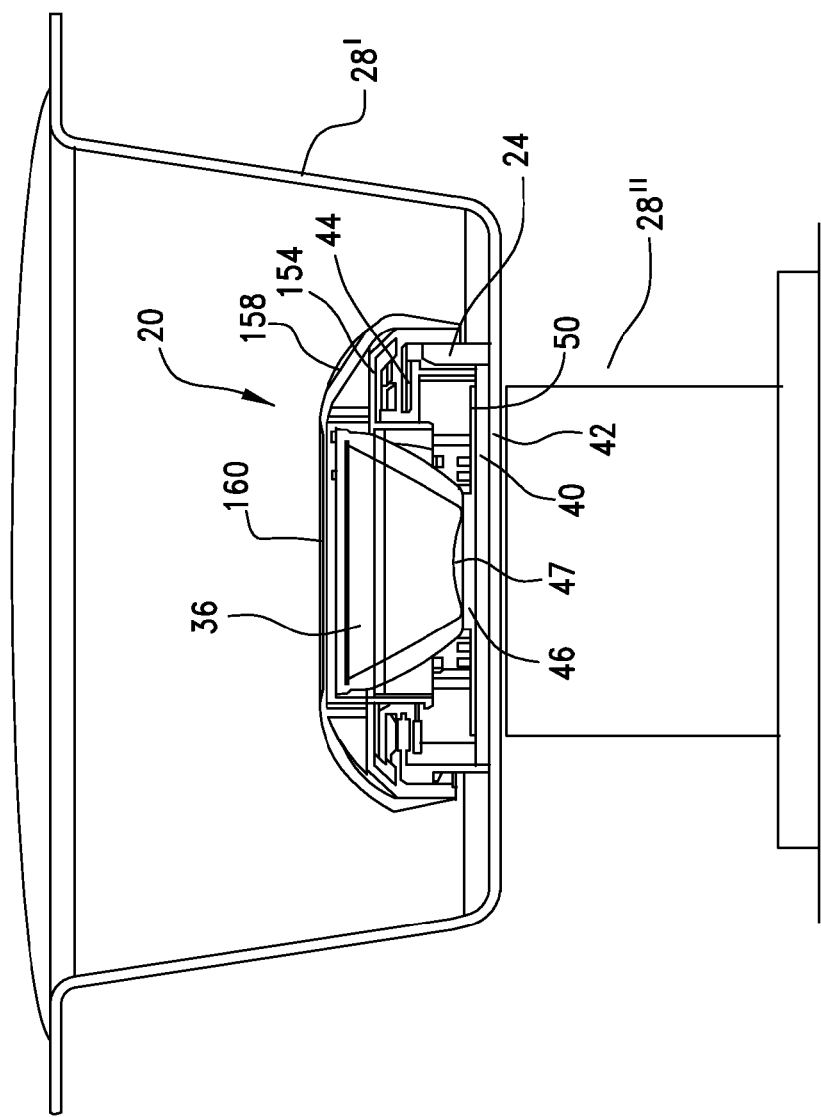
FIG. 25 is a cross-sectional view of the light module and heat sink.
Figure 26:
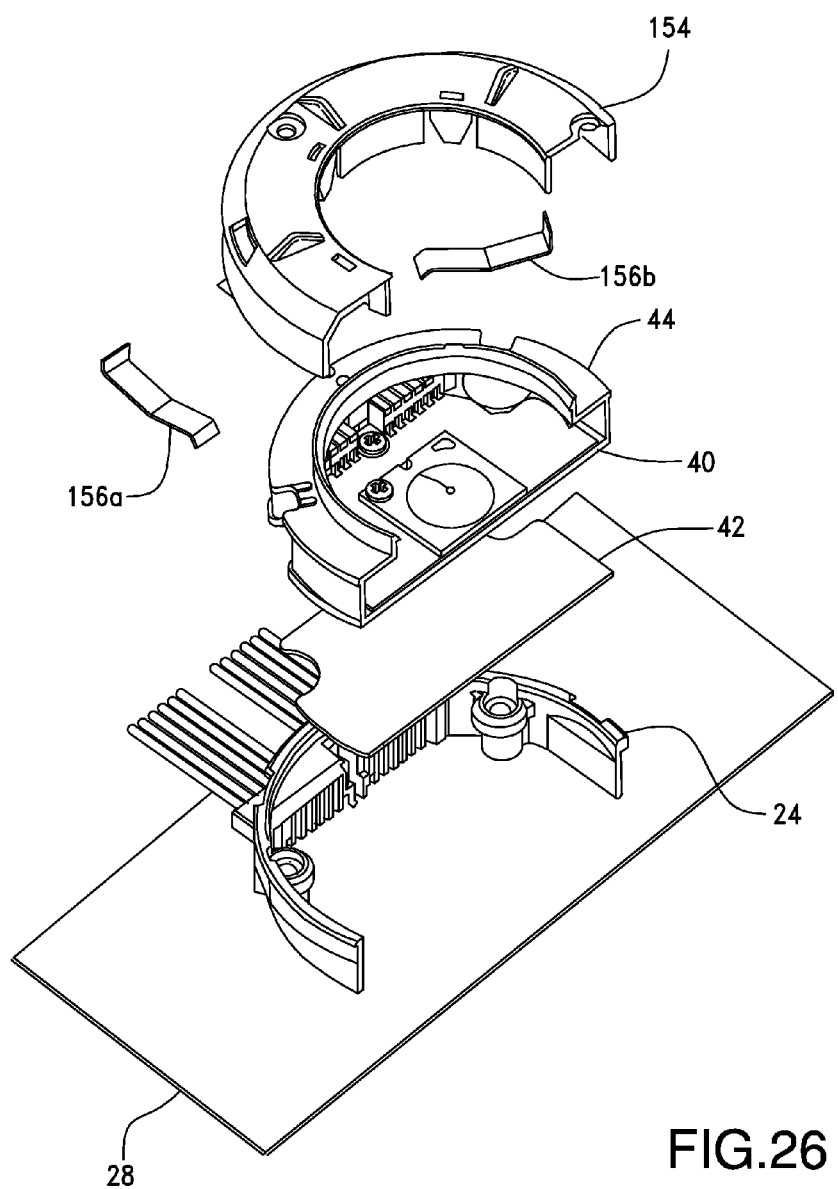
FIG. 26 is a simplified perspective view of a cross-section of an embodiment of a module.
Figure 27:
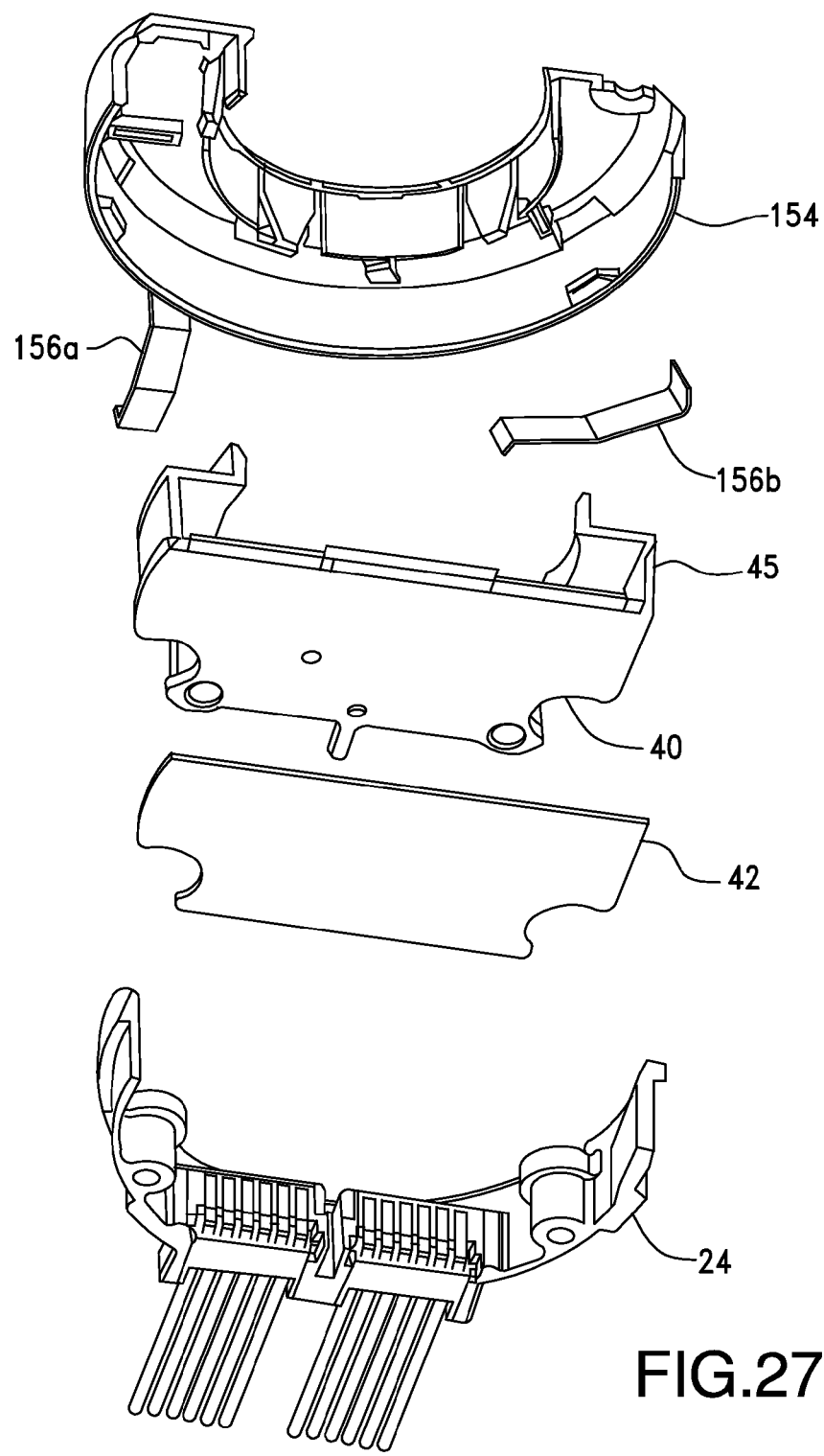
FIG. 27 is another simplified perspective view of the cross-section depicted in FIG. 26.
Figure 28:
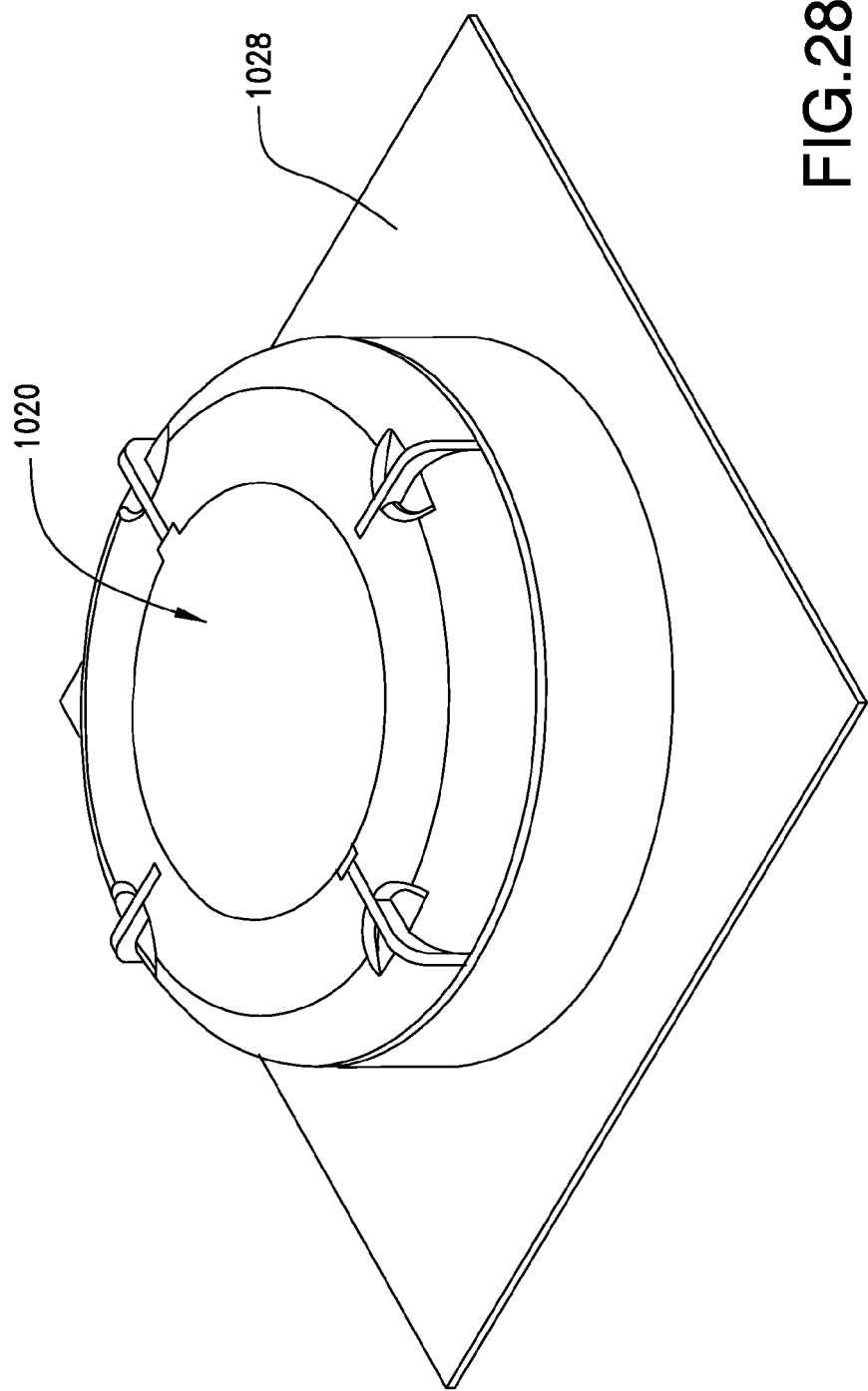
FIG. 28 is a perspective view of a light module which incorporates the features of a second embodiment of the invention, and which is mounted on heat sink.
Figure 29:
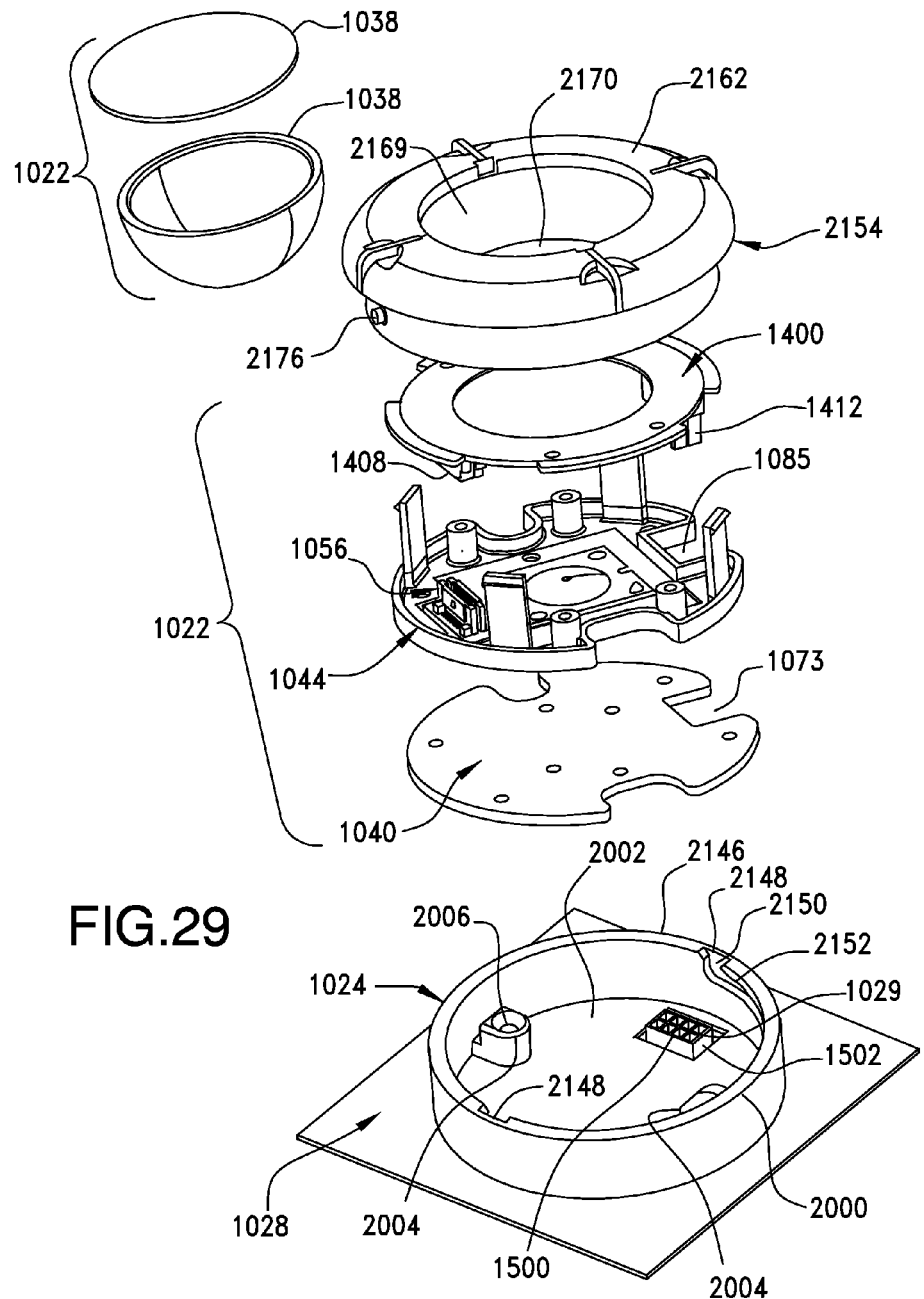
FIG. 29 is an exploded perspective view of the light module and heat sink of FIG. 28.
Figure 30:
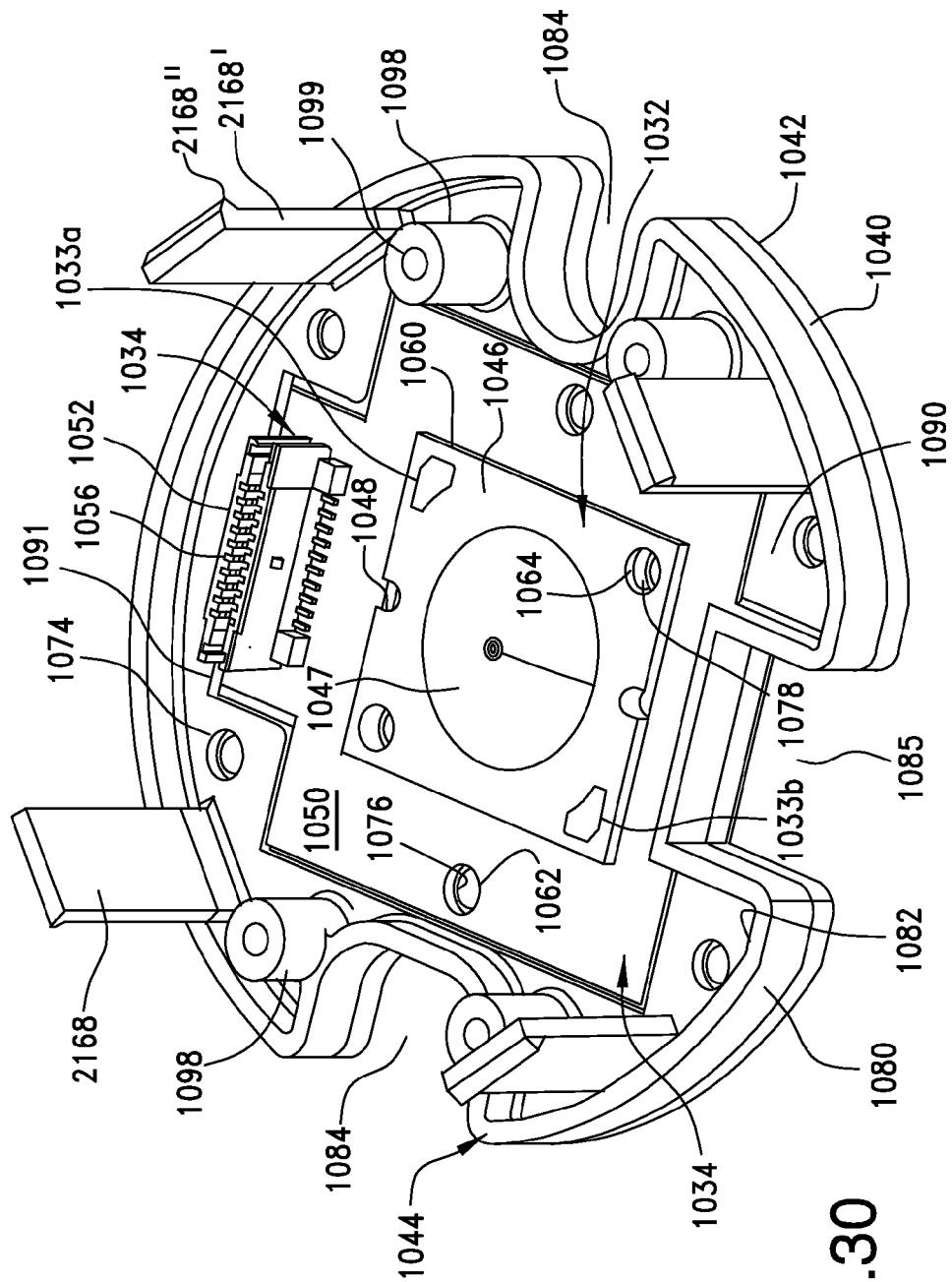
FIG. 30 is a perspective view of some components of a LED assembly which forms part of the light module of FIG. 28.
Figure 31:
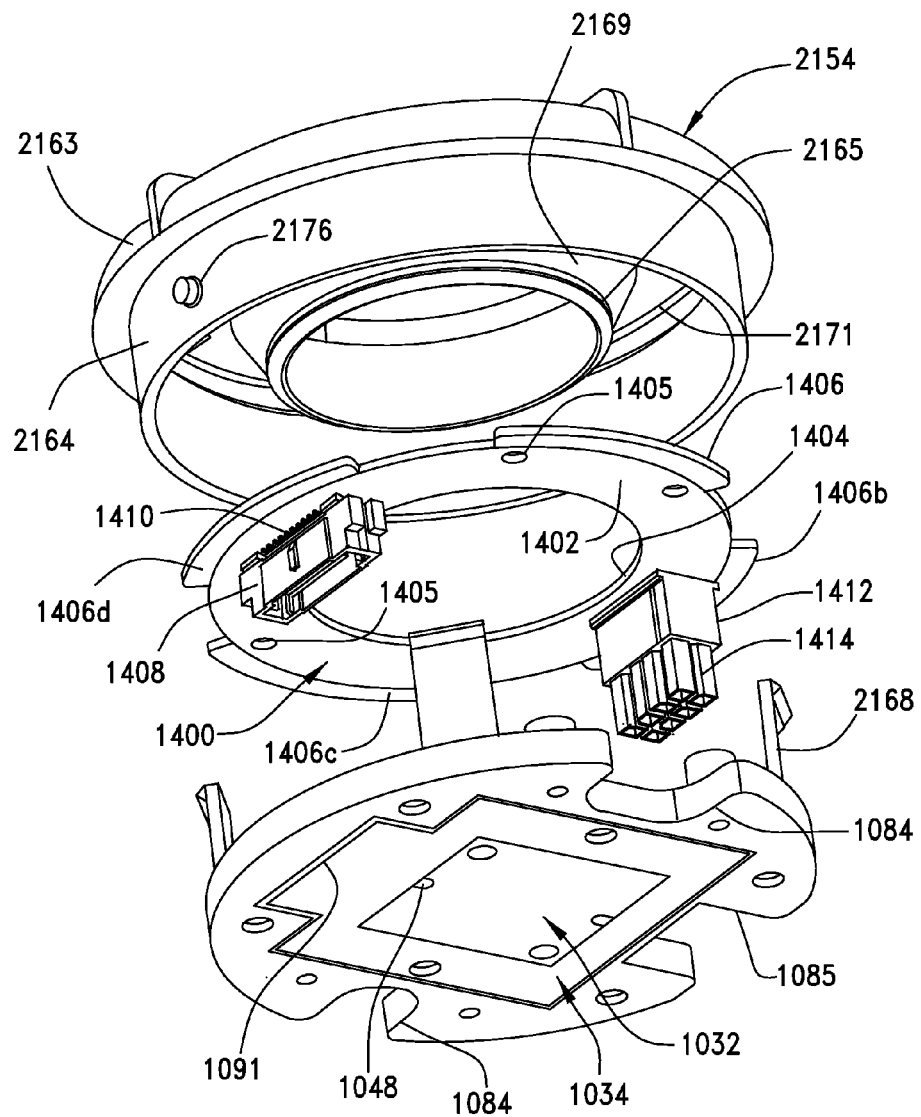
FIG. 31 is an exploded perspective view of some components of the LED assembly which forms part of the light module of FIG. 28.
Figure 32:
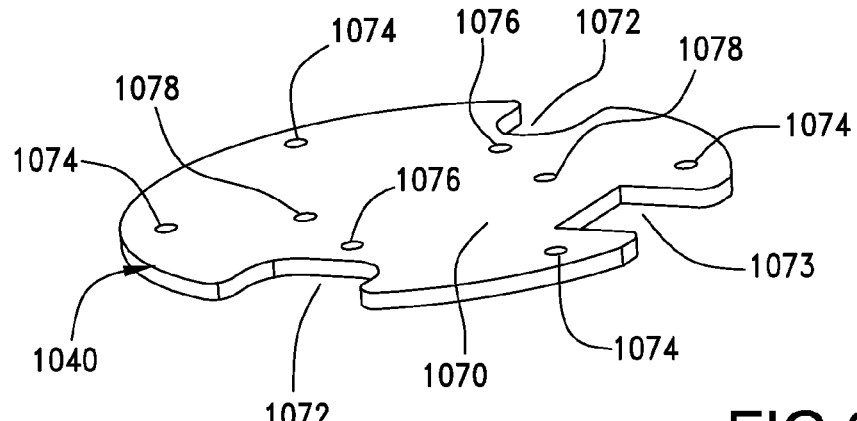
FIG. 32 is a perspective view of a heat spreader which forms part of the light module of FIG. 28.

As can be appreciated, the support surface 28 includes various optional features that may be used independently or coupled together. The first feature is a heat sink 28' that is shown in FIG. 23 and includes a base 188 and a plurality of spaced-apart, elongated fins 190 radially extending from the base 188. The base 188 has a recess (not shown) in its lower end. A plurality of apertures 192 are provided through the base 188 and align with the apertures 106 through the frame supports 104 for receiving fasteners for connecting the receptacle 24 to the base 188. The second feature is support member 28" as shown in FIG. 24, which includes a concave or cup-like housing 194. The concave or cup-like housing 194 has a lower wall 196, a circular side wall 198 extending upwardly therefrom, and a flange 200 extending outwardly from the upper end of the side wall 198. Aperture(s) 202 are provided through the side wall 198 to permit passage of the terminal wires 128, 132 therethrough for connection to an outside power source. The light module 20 seats within the concave or cup-like housing 194 as shown in FIG. 1 such that the receptacle 24 seats on the lower wall 196 and the circular side wall 198 extends upwardly relative to the light module 20. A plurality of apertures are provided through the lower wall 196 and align with the apertures 106 through the frame supports 104 for receiving fasteners for connecting the receptacle 24 to the lower wall 196. If the heat sink 28' is used in combination, the fasteners used to connect the receptacle 24 to the lower wall 196 can also extend into the apertures 192.

The inner surface of the cup-like housing 196 (which may be faceted in a vertical and horizontal manner, or only in a vertical or horizontal, or without facets if a different effect is desired) may be plated or coated so as to be reflective (with a reflectivity of at least 85 percent in the desired spectrum) and in an embodiment may be highly reflective (more than 95 percent reflective in the desired spectrum) and may be specular. The outer surface of the heat sink 28' and the support member 28" may have a similar reflectivity to the inner surface but can be diffuse. In certain applications, providing a diffuse finish on the outer surface can help allow the light module 20 to blend in and essentially disappear when installed in a fixture, thus improving the overall aesthetics of the resultant light fixture. The diffuse finish can be provided by a different coating and/or by providing a textured surface that tends to scatter light. For other applications, the inner surface and the outer surface can independently have either a specular or a diffuse appearance (for a possible four combinations). Thus, in an embodiment the cup-like housing 196 can have a different finish on the inner surface than the outer surface.

In operation, the LED assembly 22 can be assembled with the cover assembly 26. Thereafter, the LED assembly 22/cover assembly 26 can be mounted onto the receptacle 24 (which is already mounted on the support surface 28). When the LED assembly 22/cover assembly 26 are mounted on the receptacle 24, the projections 176a, 176b, 176c pass through openings 148a, 148b, 148b of slots 146a, 146b, 146c and into the first legs 150a, 150b, 150c. A user translates the cover assembly 26 (as depicted, the translation is a rotation) which causes the upper wall 162 of the inner cover 154 to translate in a vertical direction. This is turn causes biasing element (e.g., springs 156a, 156b, 156c) to compress between the upper wall 162 of the inner cover 154 and the base wall 80 of the frame 44. In other words, the cover assembly 26 can be rotated relative to the frame 44 and the receptacle 24, with the projections 176a, 176b, 176c sliding along the ramped second legs 152a, 152b, 152c of the slots 146a, 146b, 146c. As the inner cover 154 is rotated, the ramped surface of the slots 146a, 146b, 146c causes the inner cover 154 to translate downward toward the receptacle 24. Thus, as can be further appreciated from FIGS. 26A, 26B, the inner cover 154 and biasing element (e.g., the springs 156a, 156b, 156c) push against the base wall 80 of the frame 44 and cause the LED assembly 22 to move downwardly relative to the receptacle 24. However, the frame 44 moves vertically while the inner cover 154 translates in two directions (e.g., is rotated and moves downward). The ability to have a predominantly vertical translation of the heat spreader 40 and the corresponding thermal pad 42 helps ensure there is sufficient force between the heat spreader 40 and the support surface 28 (e.g., places the thermal pad 42 in compression so that a good thermal connection between the heat spreader 40 and the support surface 28 is obtained) without undesirably affecting the mating interface between the thermal pad 42 and the support surface 28. The translation causes the terminals 56 of the LED assembly 22 to move into contact with the second legs 138 of the terminals 130, 134 of the terminal wire assembly 30. Once the final desired position is attained, the biasing element (which can rotate with the inner cover 154 as depicted or can be a compliant-type material that the inner cover 154 slides over) helps ensure a continual force is exerted so as to keep the thermal pad 42 in compression between the heat spreader 40 and the support surface 28. Due to the expected long life of the device (30,000 to 50,000 hours), it is expected that a steelbased alloy may be a beneficial spring material as it tends to have good resistance to creep and/or relaxation that could be caused by thermal cycles. As a result, a desirable low thermal resistivity between the heat spreader 40 and the support surface 28, preferably less than 3 K/W, is provided. In an embodiment, the light module 20 can be configured so that less than 5 K/W watt thermal resistivity between the LED array 47 and the support surface 28 is provided. In an embodiment, the thermal resistivity between the LED array 47 and the support surface 28 can be less than 3 K/W and highly efficient systems, the thermal resistivity between the LED array 47 and the support surface 28 can be less than 2 K/W, as noted above. Thereafter, the outer decorative cover 158 and its diffuser 160 are attached to the inner cover 154 as discussed herein.

It should be noted that the surface of the support surface 28 may not be uniform or have a high degree of flatness. To account for such potential variability, a thicker thermal pad 42 might provide certain advantages that overcome the potential increase in thermal resistance that the use of a thicker thermal pad material might otherwise entail. Therefore, the ability to adjust the thickness of the thermal pad 42 and the force exerted by the biasing member is expected to be beneficial in increasing the reliability of the light module 20 so as to help ensure desired thermal resistivity.

As can be appreciated, if the LED module 32 fails (which is expected to occur much less frequently than current light sources), the LED assembly 22/cover assembly 26 can be detached from the receptacle 24/support surface 28 by rotating the LED assembly 22/cover assembly 26 the opposite way and lifting the LED assembly 22/cover assembly 26 off of the receptacle 24. Thereafter, a new LED assembly 22/cover assembly 26 can be attached to the receptacle 24 in the manner described herein. Because the second legs 138 are recessed within the second housing 126/the base wall 100, when the LED assembly 22/cover assembly 26 is removed from the receptacle 24/support surface 28, if a user inserts a conductive object (such as a screwdriver) into the receptacle 24, it will be more difficult to have the conductive object come into contact with the second legs 138. This provides a safety feature of the light module 20.

While the shown configuration of the light module 20 has the slots 146a, 146b, 146c on the receptacle 24 and the projections 176a, 176b, 176c on the inner cover 154, the slots 146a, 146b, 146c can be provided on the inner cover 154 with the projections 176a, 176b, 176c on the receptacle 24. Likewise, while the shown configuration of the light module 20 has the springs 156a, 156b, 156c mounted on the inner cover 154, the springs 156a, 156b, 156c could instead be mounted on the frame 44.

Attention is now invited to the second embodiment of the light module 1020 shown in FIGS. 28-34. The light module 1020 includes a LED assembly 1022, an insulative receptacle 1024 and an insulative cover 2154. In this embodiment, the inner and outer covers of the first embodiment are replaced by a single cover which has the projections thereon and the decorative features thereon. It is to be understood that in the first embodiment, the inner and outer covers could also be replaced by a single cover. The light module 1020 is connected to a support surface 1028 (which may also be referred to as a heat sink) for supporting the LED assembly 1022 and for dissipating thermal energy.

As shown, the support surface 1028 is flat, but it could take the forms shown in the first embodiment. The support surface 1028 has an aperture 1029 for reasons described herein. It should be noted that any desirable shape may be used for the support 1028 surface and the particular shape selected will vary depending on the application and the surrounding environment. Alternatively, the support surface 1028 may take the form of that shown in the first embodiment (modified to provide an appropriate aperture for the connector 1500 shown in this embodiment), and therefore, the specifics of the support surface are not repeated herein.

The LED assembly 1022 includes a LED module 1032, a support assembly 1034 (which may be a printed circuit board or other desirable structure), a heat spreader 1040 and a thermal pad 1042, all of which are supported, directly or indirectly, by an insulative frame 1044. The insulative frame 1044 may further help support a reflector 1036 and its associated diffuser 1038. The LED module 1032 and the support assembly 1034 are mounted on or adjacent the heat spreader 1040 (preferably the LED module 1032 is mounted securely to the heat spreader 1040 so as to ensure good thermal conductivity therebetween). The heat spreader 1040 is in turn fastened to the frame 1044 and in an embodiment can be heat-staked to the frame 1044. The reflector 1036 is positioned adjacent the LED module 1032 and can be supported directly by the LED module 1032 or can be supported by the frame 1044 or other means. The thermal pad 1042 is provided on the underside of the heat spreader 1040.

The LED module 1032 includes a generally flat thermally conductive base 1046 which can support the anode/cathode 1033a, 1033b (potentially via an electrically insulative coating provided on a top surface), and an LED array 1047 which is mounted on the top surface of the base 1046. The anode 1033a and cathode 1033b are electrically connected to the support assembly. As depicted, the base 1046 includes notches 1048, which can be used to align the base 1046, and apertures 1078 for receiving fasteners.

The support assembly 1034, as depicted, includes a printed wiring board 1050 having a connector 1052 mounted thereon, preferably on the edge thereof, and a plurality of conductive terminals 1056 housed in the connectors 1052. The printed wiring board 1050 can be of conventional design and can have traces provided therein. It should be noted that plated plastic can also be used in a support assembly. The terminals 1056 are connected to the traces on the printed wiring board 1050 in a known manner. An aperture 1060 is provided through printed wiring board 1050 in which the base 1046 of the LED module 1032 is seated. Apertures 1062 are provided through the printed wiring board 1050 for receiving fasteners to connect the printed wiring board 1050 to the heat spreader 1040. Apertures 1078 are formed through the base 1046 for receiving fasteners therethrough to connect the base 1046 to the heat spreader 1040. In an alternative embodiment, the base 1046 may be coupled directly to the heat spreader 1040 via solder or thermally conductive adhesive. If fasteners are used to couple the base 1046 and the heat spreader 1040, a thin coating of a thermal grease or paste may be beneficial to ensure there is a good thermal connection therebetween.

The reflector 1036 and diffuser 1038 can be formed just like the reflector 36 and diffuser 38 and therefore the specifics are not repeated herein. The reflector 1036 can be mounted on the base 1046 of the LED module 1032 by suitable means, such as adhesive, such that the LED array 1047 is positioned within the lower aperture of the reflector 1036.

The heat spreader 1040 is a thin plate that can be formed of copper or aluminum or other suitable material. Preferably the heat spreader will have sufficiently low thermal resistivity so as to provide for a substantial increase in surface area as compared to the LED array while providing a thermal resistance of less than 0.5 K/W. As depicted, the heat spreader 1040 has a main body portion 1070 and a pair of keyways 1072 providing notches therein. A connector recess 1073 is also provided through the main body portion 1070 for reasons described herein. As can be appreciated, the keyways 1072 helps provide an orientation feature that ensure that LED assembly 1022 is positioned correctly with respect to the receptacle 1024. Spaced apart apertures 1074 are formed in the main body portion 1070. Apertures 1076 are formed through the heat spreader 1040 and are aligned with apertures 1062 through the printed wiring board 1050 for receiving fasteners therethrough to connect the printed wiring board 1050 to the heat spreader 1040. Apertures 1078 are formed through the heat spreader 1040 and are aligned with apertures 1064 through the LED module 1032 for receiving fasteners therethrough to connect the LED module 1032 to the heat spreader 1040.

The thermal pad 1042 can be provided on the underside main body portion 1070 of the heat spreader 1040 and can generally cover the underside of the heat spreader. The thermal pad 42 can be compliant and may be tacky. The thermal pad 1042 may be a conventional thermal pad material used in the industry to thermally couple two surfaces together, such as, but not limited to, 3M's Thermally Conductive Adhesive Transfer Tape 8810. If formed of the thermally conductive adhesive gasket, the thermal pad 1042 can be cut to the desired shape from bulk stock and applied in a conventional manner and could have one side that includes an adhesive for adhering to the heat spreader 1040 while the other side could be removably positioned on support surface 1028 (e.g., the heat sink). Of course, the thermal pad 1042 could also be provided via the use of a thermally-conductive paste or a thermally conductive epoxy positioned on the heat spreader 1040. The benefit of using a pad with one adhesive side is that the thermal pad 1042 can be securely positioned on the heat spreader 1040 and compressed between the heat spreader 1040 and the resulting support surface 1028 while allowing the thermal pad 1042 (and the associated components) to be removed if there is a desire to replace or upgrade the corresponding components.

Similar to that of the first embodiment, the printed wiring board 1050 seats on the main body portion 1070 of the heat spreader 1040, and the base 1046 of the LED module 1032 seats within the aperture 1060 through the printed wiring board 1050 and seats on the main body portion 1070 of the heat spreader 1040. Thus, the LED module 1032 can be in direct thermal communication with the heat spreader 1040 and the thermal interface between the LED module 1032 and the heat spreader 1040 can be controlled so as to reduce thermal resistivity to a level that can be less than 3 K/W and more preferably below 2 K/W. For example, if desired, the base 1046 can be coupled to the heat spreader 1040 via a solder operation that allows for very efficient thermal transfer between the base 1046 and the heat spreader 1040. As the area of the base 1046 can be less than 600 mm$^2$ and the area of the heat spreader 1040 can be more than double the area and in an embodiment can be more than three or four times the area (in an embodiment the heat spreader area can be greater than 2000 mm$^2$, the total thermal resistance between the LED array 1047 mounted and the support surface can be less than 2.0 K/W. Naturally, this assumes the use of a thermal pad with good thermal performance (conductivity preferably better than 1 W/m-K) but because of the larger area and the ability to use a thin thermal pad (potentially 0.5-1.0 mm thick or even thinner), such performance is possible with a range of thermal pad materials.

The frame 1044 is formed from a generally circular vertical base wall 1080 defining a passageway 1082 therethrough. A plurality of inwardly extending keyways 1084, which as shown are two in number, are provided in the base wall 80. A connector recess 1085 is also provided in the base wall 80 for reasons described herein. A lower horizontal wall 1090 is provided at the lower end of the base wall 1080 and has an aperture 1091 is provided therethrough in which the base 1046 of the LED module 1032 passes. A plurality of feet 1098 extend upwardly from the lower wall 1090 and have a passageway 1099 therethrough. A pair of holding projections 2168 extend upwardly from the lower wall 1090 at spaced apart locations. Each holding projection 2168 includes a flexible arm 2168' extending from the lower wall 1090 with a head 2168" at the end thereof.

The main body portion 1070 of the heat spreader 1040 abuts against the bottom surface of the lower wall 1090 and the keyways 1072 align with the keyways 1084 and the connector recess 1073, 1085 align. Fasteners are passed through aligned apertures 1074 in the main body portion 1070 and in the lower wall 1090 to couple the heat spreader 1040 to the frame 1044.

As shown, a bridge board 1400 is provided between the frame 1044 and the cover 2154. The bridge board 1400 is attached to the cover 2154 as described herein. The bridge board 1400 is formed of a circular base wall 1402 having a central passageway 1404 therethrough. A plurality of spaced apertures 1405 are provided through the base wall 1402. A plurality of spaced apart flanges 1406a, 1406b, 1406c, 1046d extend radially outwardly from the base wall 1402. The holding projections 2168 of the frame 1044 extend in the gaps between the flanges 1406a, 1406b, 1406c, 1046d and the passageway 1099 through the feet 1098 align with the apertures 1405 in the base wall 1402. Pins (not shown) extend through the aligned passageways 1099/the apertures 1405 to mate the bridge board 1400 with the frame 1044. The bridge board 1400 can move upwardly and downwardly relative to the frame 1044. A connector 1408 having conductive terminals 1410 therein extends downwardly the bridge board 1400 and mates with the connector/terminals 1052/1056 on the printed wiring board 1050. A connector 1412 having conductive terminals 1414 thereon extends downwardly the bridge board 1400, extends through the connector recesses 1085, 1073 in the frame 1044 and the heat spreader 1040 and couples to an external connector 1500 which extends through the aperture 1029 in the support surface 1028. The external connector 1500 has a plurality of conductive terminals 1502 which are recessed within passageways in the housing of the connector 1500.

Since the conductive terminals 1502 are recessed within the housing of the connector 1500, when the LED assembly 1022/cover 2154 is removed from the receptacle 1024/support surface 1028, if a user inserts a conductive object (such as a screwdriver) into the receptacle 1024, it will be very difficult to have the conductive object come into contact with the conductive terminals 1502. This provides a safety feature of the light module 1020.

As depicted, power is provided to connector 1412 via external connector 1500. The power can be processed by the circuit on the bridge board 1400 and then provided to the connector 1408, which passes power to the connector 1056. The power is then coupled to the anode/cathode 1033a/1033b of the LED array 1047. It should be noted that the power provided by the coupling between connector 1500 and the connector 1412 can also provide control signals (either via separate signal line(s) or via modulated signals). Alternatively, the LED array 1047 (or LED array 47 of the first embodiment) could be configured to receive control signals wirelessly by including a receiver/transceiver 1616 and an antenna 1614 in control circuitry 1600. In addition, for simple modules (such as modules that receive constant current or AC current for AC LED arrays), the control circuitry 1600 can be mounted remotely to the LED array 1047 so that the current delivered to the LED array 1047 is adjusted as desired. In such a configuration, the connector 1412 could be mounted directly to the base 1046 and the bridge board 1400 and the connectors 1056, 1408 could be eliminated. Alternatively, if the appropriate AC power is provided to the module, the circuitry can be positioned a board in the module (e.g., board 1050).

The receptacle 1024 includes a circular base wall 2000 having a passageway 2002 therethrough. A pair of frame supports 2004 extend inwardly from the inner surface of the base wall 2000 and form keys. Each frame supports 2004 commences at the lower end of the base wall 2000 and terminates below the upper end of the base wall 2000. An aperture 2006 is provided through each frame support 2004.

The passageway 2002 of the receptacle 1024 receives the LED assembly 1022 therein. The lower surface of the wall 1090 seats on the heat spreader 40. The frame supports/keys 2004 seat within the keyways 1072, 1084. In addition, the connector 1500 seats within connector recesses 1073, 1085. As such, the frame supports/keys 2004 and keyways 1072, 1084 and the connector 1500 provide a polarizing feature to ensure the correct orientation of the LED assembly 1022 with the receptacle 1024. The LED assembly 1022 can move upwardly and downwardly relative to the receptacle 1024 but as depicted, is limited in its ability to rotate with respect to the receptacle 1024.

The inner surface of the base wall 2000 has a pair of generally L-shaped slots 2146 formed thereon which are diametrically opposed from each other. The opening 2148 of each slot 2146 is at the upper end of the base wall 2000. Each slot 2146 has a first leg 2150 which extends perpendicularly downwardly from the upper end of the base wall 2000 and a second leg 2152 which extends from the lower end of the first leg 2150, and extends downwardly and around the outer surface of the base wall 2000. As a result, the surfaces which form the upper and lower walls of the second legs 2152 form ramps. As shown, two slots 2146 are provided on the outer surface of the base wall 2000, but more than two slots may be provided. The ends of the second legs 2152 opposite to the respective first legs 2150 may be open to the lower end of the base wall 2000.

The cover 2154 includes an upper circular wall 2162, an outer wall 2163 extending radially outwardly and downwardly from the outer edge of the upper wall 2162, a base wall 2164 extending downwardly from the inner edge of the outer wall 2163, and an inner wall 2169 extending from the inner edge of the upper circular wall 2162. The inner wall 2169 is concave, is spaced from the base wall 2164, and has an outwardly extending lip 2165 at its lower end. A shoulder 2171 is formed at the junction between the outer wall 2165 and the base wall 2164. A central passageway 2170 is formed by the inner wall 2169 in which the reflector 1036 is seated. A pair of projections 2176 extend outwardly from the base wall 2165 and are diametrically opposed from each other. A plurality of grips 2173 are provided on the upper wall 2162 and extend along the outer wall 2163 to enable a user to easily grasp the cover 2154.

The inner wall 2169 of the cover 2154 seats within the passageway 1404 through the bridge board 1400 and the bridge board 1400 is seated above the lip 2165. As a result, the bridge board 1400 is fixed in an upward and downward direction relative to the cover 2154, but the cover 2154 can rotate relative to the bridge board 1400. This helps provide a beneficial assembly that is suitable for shipping without concerns that the bridge board 1400 (or components mounted thereon) would be damaged while traveling through a distribution chain.

The cover 2154 is mounted on the frame 1044 with the bridge board 1400 sandwiched therebetween. The arms 2168' on the holding projections 2168 flex inwardly as the heads 2168" slide along the base wall 2164 until the heads 2168" pass the shoulder 2171 and resume their original state, such that the holding projections 2168 prevent the removal of the cover 2154 from the frame 1044. As a result, the cover 2154 and the frame 1044 are snap-fit together, but the cover 2154 is rotatable relative to the frame 1044. The lower end of the base wall 2164 of the cover 2154 abuts against the upper end of the base 1080 of the frame 1044.

The subassembly formed from the cover 2154/bridge board 1400/frame 1044 is then inserted into the receptacle 1024. The base wall 2000 of the receptacle 1024 encircles the base wall 2164 of the cover 2154.

In operation, when the subassembly formed from the cover 2154/bridge board 1400/frame 1044 is mounted on the receptacle 1024, the projections 2176 pass through openings 2148 of slots 2146 and into the first legs 2150. A user translates the cover 2154 (as depicted, the translation is a rotation) relative to the frame 1044, the bridge board 1400 and the receptacle 1024, with the projections 2176 sliding along the ramped second legs 2152 of the slots 2146. As the cover 2154 is rotated, the ramped surface of the slots 2146 causes the cover 2154 to translate downward toward the receptacle 1024. The lower end of the base wall 2164 presses against the upper end of the base wall 1080, which, in turn, presses the frame 1044 against the heat spreader 1040. However, the frame 1044 and bridge board 1400 move vertically while the cover 2154 translates in two directions (e.g., is rotated and moves downward). The ability to have a predominantly vertical translation of the heat spreader 1040 and the corresponding thermal pad 1042 helps ensure there is sufficient force between the heat spreader 1040 and the support surface 1028 (e.g., places the thermal pad 1042 in compression so that a good thermal connection between the heat spreader 1040 and the support surface 1028 is obtained) without undesirably affecting the mating interface between the thermal pad 1042 and the support surface 1028. The translation causes the terminals 1056 of the LED assembly 1022 to move into further contact with the terminals 1410 of the connector 1408 and the connector 1412 to further engage the connector 1500. As a result, a desirable low thermal resistivity between the heat spreader 1040 and the support surface 1028, preferably less than 2 K/W, is provided. In an embodiment, the light module 1020 can be configured so that there is less than 5 K/W thermal resistivity between the LED array 1047 and the support surface 1028. In an embodiment, the thermal resistivity between the LED array 1047 and the support surface 1028 can be less than 3 K/W and in highly efficient systems, the thermal resistivity can be less than 2 K/W, as noted above. If desired, a biasing element, like that disclosed in the first embodiment, may be incorporated into the light module 1020, provided the frame 1044/bridge board 1400 and cover 2154 are modified to allow upward and downward movement between these components.

It should be noted that the surface of the support surface 1028 may not be uniform or have a high degree of flatness. To account for such potential variability, a thicker thermal pad 1042 might provide certain advantages that overcome the potential increase in thermal resistance that the use of a thicker thermal pad material might otherwise entail.

As can be appreciated, if the LED module 1032 fails (which is expected to occur much less frequently than current light sources), the LED assembly 1022/cover 2154 can be detached from the receptacle 1024/support surface 1028 by rotating the LED assembly 1022/cover 2154 the opposite way and lifting the LED assembly 1022/cover 2154 off of the receptacle 1024. Thereafter, a new LED assembly 1022/cover 2154 can be attached to the receptacle 1024.

Figure 34:
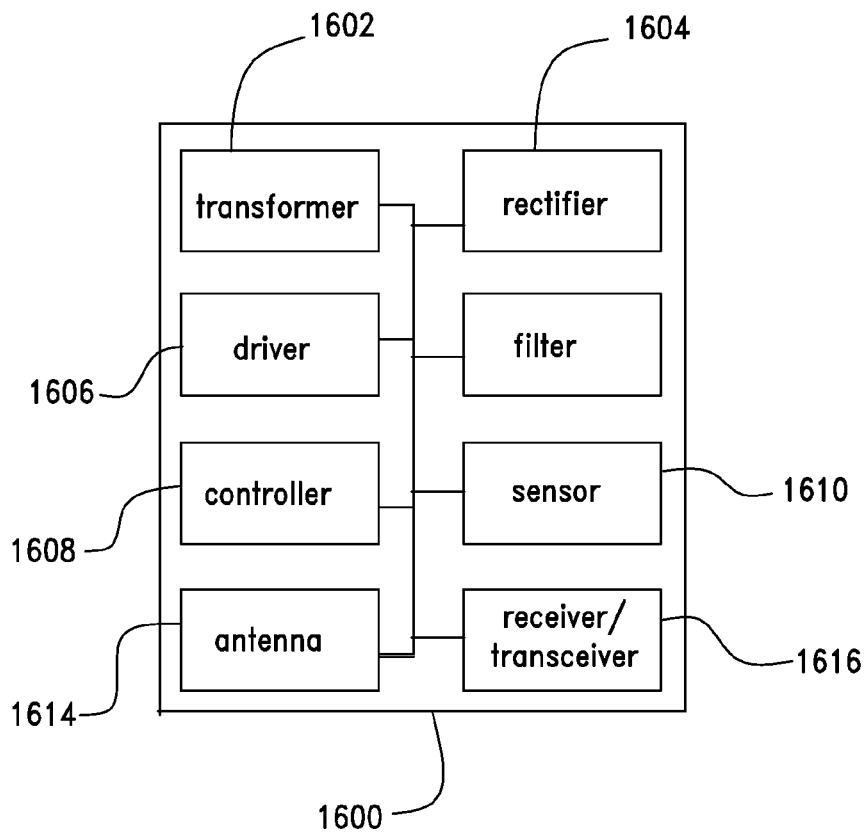
FIG. 34 is a block diagram of a control system for the light module.
Figure 33:
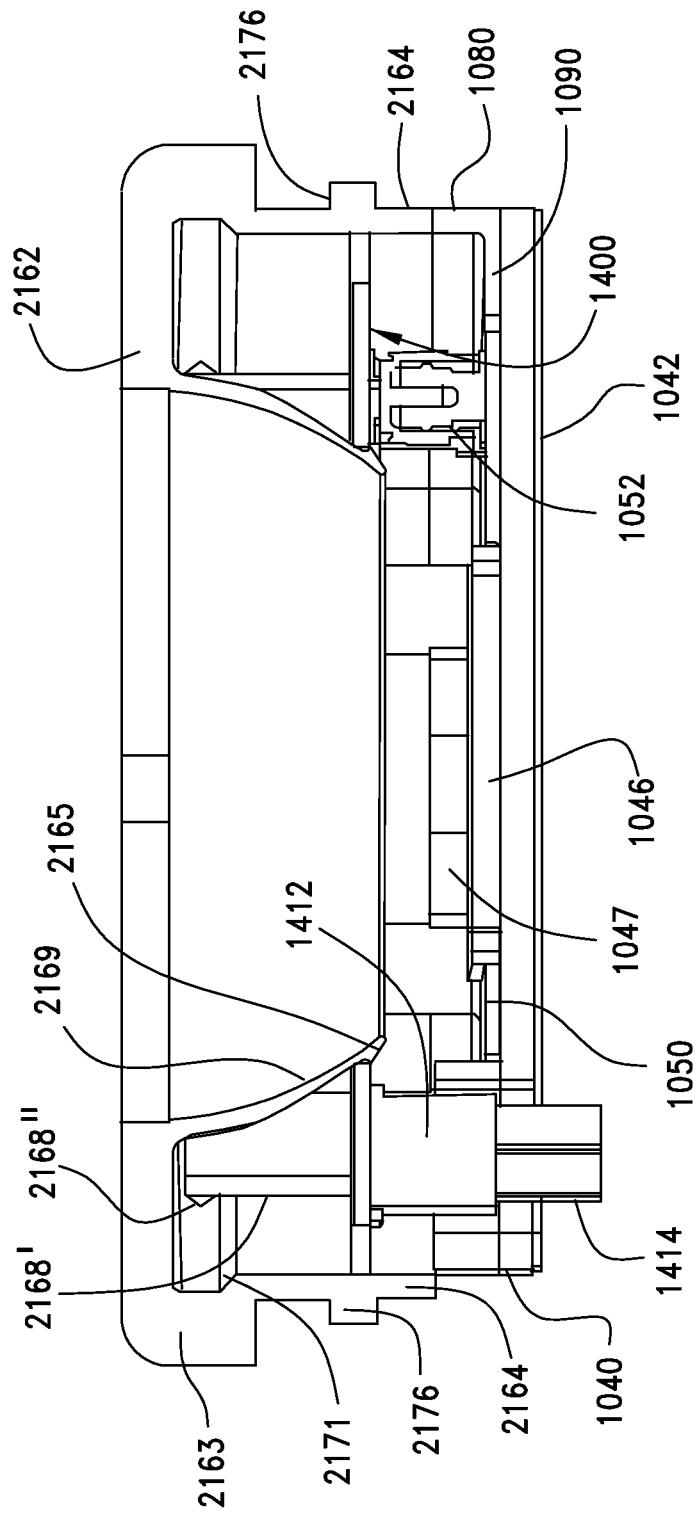
FIG. 33 is a cross-sectional view of some components of the LED assembly which forms part of the light module of FIG. 28.

The control circuitry 1600 for operating the light module 1020 is shown in a schematic representation in FIG. 34. One or more of the individual circuit components shown in FIG. 34 can be provided. For example, if the LED array 1074 (or LED array 47 of the first embodiment) was intended to receive 120 volt AC power and included an LED array that was configured to be powered by low voltage constant current, a transformer 1602, a rectifier 1604 and a current driver 1606 might be included. However, if the power source provided controlled constant current than none of the depicted circuit components would be needed. Thus, the circuitry 1600 can be adjusted to match the LED element and the power source. Optional features such as a sensor 1608 and/or controller 1610 would allow for closed loop operation via sensed factors such as light output, proximity, movement, light quality, temperature, etc. Furthermore, an antenna 1614 and receiver/transceiver 1616 would allow for wireless control of the LED array 1074 through protocols such as ZIGBEE, RADIO RA, or the like. The controller 1608 could further include programmability if desired. Thus, substantial variability in the design of the light module 1020 is possible.

While the shown configuration of the light module 1020 has the slots 2146 on the receptacle 1024 and the projections 2176 on the cover 2154, the slots 2146 can be provided on the cover 2154 with the projections 2176a on the receptacle 1024. In addition, cover 2154 could be configured so that it fits over (rather than into) the receptacle 1024. Furthermore, certain control circuitry could be provided in the base 1050 rather than in the bridge board 1400.

The LED array 47, 1047 could be a single LED or it could be number of LEDs electrically coupled together. As can be appreciated, the LED(s) could be configured to function with DC or AC power. The advantage of using AC LEDs is there is may be no need to convert conventional AC line voltage to DC voltage. The advantage of using DC based LEDS is the avoidance of any flicker that might be caused by the AC cycle. Regardless of the number or type of LEDs, they may be covered with a material that takes the wavelength generated by the LED and converts it to another wavelength (or range of wavelengths). Substances for providing such conversion are known and include phosphorous and/or quantum-dot materials, however, any desirable material that can be excited at one wavelength range and emit light at other desirable wavelengths may be used. As can be appreciated, the conversion substances need not be located directly on the LED but instead could be moved some distance away. Using such a remote conversion location, particularly if a phosphorous material is used, has the advantage of moving the phosphorus material away from the heat source but such a design tends to grow the size of the module thus it may be preferable to using a conversion substance that is not affected by the heat and keep it closer to the LED in certain configurations.

In order to dim the LED array 47, 1047, a DMX DALI protocol can be used for dimming. As shown in the first embodiment, for example, six terminals 130, 136 are provided through each housing 124, 126. In this protocol, the terminals 130, 136 can be assigned different keys. For example, in housing 124, the terminals 130 can be assigned the following:
 Terminal 1=key Ground
 Terminal 2=key DALI or DMX
 Terminal 3=key DALI or DMX
 Terminal 4=key 0-10V
 Terminal 5=key Triac Signal
 Terminal 6=key 24VDC
and in housing 126, the terminals 130 can be assigned the following:
 Terminal 1=key 1.4A CC
 Terminal 2=key 0.7A CC
 Terminal 3=key 0.35A CC
 Terminal 4=key TBD CC
 Terminal 5=key unassigned
 Terminal 6=key Ground Therefore, predetermined ones of the terminals 130, 136 can be active depending upon which type of LED array 47 is provided. Thus, when the terminals 56 of the LED assembly 22 engage with the terminals 130, 134 of the terminal wire assembly 30, not all of the terminals 56, 130, 134 need to be active. Of course, as can be appreciated, any desirable dimming protocol can be used and the module may be configured to accept an input that provides for dimming and the module may be configured to receive input from different type of dimming protocols by selectively configuring certain terminals for use with certain protocols, as depicted above.

In an embodiment, the terminals could be configured to receive 12 volt AC input rather than constant current. The circuitry 1600 could be configured to convert 12 volt AC into the appropriate DC drive current and voltage, which would be based on the design of the LED array. For example, if the LED array was configured to operate on a higher forward voltage manner, then the circuitry 1600 could be configured to convert the 12 volt AC into a desired DC forward voltage that was greater than the AC voltage. As can be appreciated, the benefit of such a design is that the AC voltage being applied to the module is relatively low, thus reducing the need to have insulating materials to protect from inadvertent touching of contacts in the socket. Furthermore, as 12 volt AC power is readily obtainable with the use of a transformer, it becomes possible to provide a long lasting fixture that includes a receptacle and is configured to convert higher AC line voltage (which may be 120, 220 or some other voltage AC) to a 12 volt (or 24 volt) AC power. Thus, the existing wiring and power footprint of the facility where the fixture is being installed can be preserved while the conversion electronics in the fixture can be easily made to last a very long time.

If desired, the conversion circuitry 1600 can even be configured to accept 12 or 24 volt DC, thus allowing considerable flexibility in the input power. For example, this would allow for convention line AC voltage to be converted in a fixture using long lasting transformers while also allowing the use of DC current that might be generated by a renewable energy source such as solar power or wind power or the like (thus avoiding the need to convert the DC power generated by such a renewable power source into AC). In either case, the ability to have a relatively compact circuitry allows the circuitry to be placed in a desired location in the module (e.g., on the board 1050)

For example, the circuitry 1600 could include a rectifier 1604 and one or more filters (which could be capacitors) to filter and shape the design of the AC current into a relatively smooth DC current along with a driver 1606 while omitting the rest of the elements. The driver 1606 could be an integrated circuit (such as is available from a number of sources) that would accept the input power and convert it to the desired output current and voltage (by either boosting or reducing the input voltage to the desired voltage). As can be appreciated, as a rectifier could also pass DC current, such a design would allow for considerable flexibility. In addition, if desired, the driver 1606 could be configured to have an adjustable output and be configured to respond to input from a dimmer switch. As the design of such circuitry is well know in the art and numerous alternative design choices are possible and within the scope of one of ordinary skill in the art and the selection would depending on the system performance requirements, nothing more will be said about the circuitry. However, in general, such a design could be provided with two inputs for power and some number of inputs for control such that the total number of inputs could be less than six and preferably not more than four. It should be noted that one significant advantage of such a design is that it allows for a fixture with a set output (e.g., 12 volts AC) while allowing for a wide range of modules configures to be positioned in the fixture and still function as each module could be configured with the appropriate circuitry, thus allowing the fixture and receptacle to be considered future proof. This would also allow for future modules that were more efficient to be inserted into the receptacle while still providing comparable light output.

In an embodiment, the heat spreader 40, 1040 can be modified to have a polyamide coating (or similar coating with insulative properties) with conductive traces provided thereon. The support 50 can then be eliminated, and the connectors 52a, 52b, 54a, 54b with their associated conductive terminals 56 and the LED array 47 can be mounted on the heat spreader 40 and electrically connected to the traces on the modified heat spreader 40. As can be appreciated, mounting the LED array 47 directly to the heat spreader 40 would provide further improvements to the thermal resistivity of the light module 20 and potentially allow the thermal resistivity between the LED array 47 and the support surface 28 to be below 1.5 K/W. Naturally, such efficient heat transfer will allow smaller support surfaces 28 as the interface between the support surface 28 and the environment will be the primary driver as to the total thermal resistivity of the light module 20.

While the shape of the reflector 36, 1036 is shown as generally conical, other shapes for the reflector 36, 1036 can be provided. For example, the reflector 36, 1036 could have a flattened side, could be oval, etc. Changing the shape of the reflector 36, 1036 enables a variety of light patterns to be cast by the light module 20, 1020. Since the light module 20, 1020 has the polarization feature (in the first embodiment: the key 92 and keyway 144 provide a polarizing feature; and in the second embodiment: the frame supports/keys 2004 and keyways 1072, 1084 and the connector 1500 seating within connector recesses 1073, 1085 provide a polarizing feature), the design of the reflector 36, 1036 can be changed and the light pattern accordingly controlled.

While preferred embodiments of the present invention are shown and described, it is envisioned that those skilled in the art may devise various modifications of the depicted disclosure without departing from the spirit and scope of the appended claims.

We claim:

1. An illumination system comprising:
  a receptacle with first and second contacts, the receptacle mounted on a heat sink that includes a top surface, wherein the receptacle has one of a ramp and a shoulder;
  a light emitting diode ("LED") assembly comprising a frame, a LED array supported by the frame, a heat spreader with an upper and a lower surface, the upper surface in thermal communication with the LED array and supported by the frame;
  circuitry configured to receive an input voltage of not more than 24 volts and convert such input voltage into a desired DC voltage;
  first and second terminals supported by the frame, the first and second terminals coupled to the circuitry so as to provide an input power source, the first and second terminals configured to respectively engage the first and second contacts; and
  a cover rotatably coupled to the LED assembly, the cover having the other of the ramp and the shoulder, wherein, when the cover is rotated, the shoulder and ramp engage each other and cause the cover to translate vertically and the vertical translation of the cover causes the heat spreader to translate vertically, wherein the heat spreader is configured to translate vertically without rotation so that the heat spreader is thermally coupled to the top surface.

2. The illumination system of claim 1, wherein the circuitry is configured to receive AC voltage.

3. The illumination system of claim 2, further including a thermal pad provided on a lower surface of the heat spreader.

4. The illumination system of claim 3, wherein the thermal pad is compliant.

5. The illumination system of claim 4, wherein a thermal resistance between the LED array and the heat spreader is less than 3 K/W.

6. The illumination system of claim 5, wherein the module has a thermal resistance between the LED array and the top surface that is less than 5 K/W.

7. The illumination system of claim 6, further comprising a biasing element positioned between the cover and the frame, the biasing element configured to urge the frame and heat spreader toward the top surface when the cover is rotatably translated.

8. The illumination system of claim 7, wherein the cover includes a circular base wall with a plurality of projections extending therefore.

9. The illumination system of claim 8, wherein the thermal resistance between the top surface and the LED array is less than 3 K/W.

10. The illumination system of claim 9, wherein the thermal pad has a thickness of less than one mm.

11. The illumination system of claim 10, wherein the heat spreader is formed of material that has a thermal conductivity greater than 50 W/m-K.

12. The illumination system of claim 11, wherein the heat spreader is formed of material that has a thermal conductivity greater than 100 W/m-K.

13. The illumination system of claim 12, wherein the circuitry is configured to receive 12 volt AC.

14. The illumination system of claim 13, wherein the circuitry is configured to receive 12 volt DC.

15. The illumination system of claim 14, wherein the receptacle supports 4 contacts and the frame support four terminals, the terminals and contacts configured to engage each other when the frame is seated in the receptacle.

16. An illumination system comprising:
  a receptacle with first and second contacts, the receptacle mounted on a heat sink that includes a top surface, wherein the receptacle has one of a ramp and a shoulder;
  a light emitting diode ("LED") assembly comprising a frame, a LED array supported by the frame, a heat spreader with an upper and a lower surface, the upper surface in thermal communication with the LED array and supported by the frame;
  circuitry positioned in the LED assembly that is configured to receive an AC input voltage and power the LED array;
  first and second terminals supported by the frame, the first and second terminals coupled to the circuitry so as to provide an input power source, the first and second terminals configured to respectively engage the first and second contacts; and a cover rotatably coupled to the LED assembly, the cover having another of the ramp and the shoulder, wherein, when the cover is rotated, the shoulder and ramp engage each other and cause the cover to translate vertically and the vertical translation of the cover causes the heat spreader to translate vertically, wherein the heat spreader is configured to translate without rotation so that the heat spreader is thermally coupled to the top surface.

17. The illumination system of claim 16, wherein the further including a thermal pad provided on a lower surface of the heat spreader.

18. The illumination system of claim 17, wherein the module has a thermal resistance between the LED array and the top surface that is less than 5 K/W.

19. The illumination system of claim 18, wherein the heat spreader is formed of material that has a thermal conductivity greater than 50 W/m-K.

20. The illumination system of claim 19, wherein the circuitry is configured to receive 12 volt AC.

21. The illumination system of claim 19, further comprising a biasing element positioned between the cover and the frame, the biasing element configured to urge the frame and heat spreader toward the top surface when the cover is rotatably translated.

* * * * *